United States Patent
Hatano et al.

(10) Patent No.: US 11,838,662 B2
(45) Date of Patent: *Dec. 5, 2023

(54) SOLID-STATE IMAGING DEVICE AND ELECTRONIC APPARATUS

(71) Applicant: SONY SEMICONDUCTOR SOLUTIONS CORPORATION, Kanagawa (JP)

(72) Inventors: Keisuke Hatano, Kanagawa (JP); Ryosuke Nakamura, Kanagawa (JP); Yuji Uesugi, Kanagawa (JP); Fumihiko Koga, Kanagawa (JP); Tetsuji Yamaguchi, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/689,154

(22) Filed: Mar. 8, 2022

(65) Prior Publication Data

US 2022/0264039 A1    Aug. 18, 2022

Related U.S. Application Data

(63) Continuation of application No. 16/585,976, filed on Sep. 27, 2019, now Pat. No. 11,303,834, which is a
(Continued)

(30) Foreign Application Priority Data

Nov. 5, 2015 (JP) .................... 2015-217860

(51) Int. Cl.
*H04N 25/704* (2023.01)
*H01L 27/146* (2006.01)
*H04N 25/76* (2023.01)

(52) U.S. Cl.
CPC ...... *H04N 25/704* (2023.01); *H01L 27/14623* (2013.01); *H01L 27/14632* (2013.01); *H01L 27/14687* (2013.01); *H04N 25/76* (2023.01)

(58) Field of Classification Search
CPC ......... H01L 27/14623; H01L 27/14632; H01L 27/14687; H04N 25/704; H04N 25/76
See application file for complete search history.

(56) References Cited

U.S. PATENT DOCUMENTS 5,237,436 A    8/1993  Khan et al.
6,141,304 A *  10/2000 Ogasawara ........ G11B 7/13927
                                                            369/112.02
(Continued)

FOREIGN PATENT DOCUMENTS

JP    2007-103590    4/2007
JP    2010-093619    4/2010
(Continued)

OTHER PUBLICATIONS

International Search Report and Written Opinion prepared by the European Patent Office dated Jan. 13, 2017, for International Application No. PCT/JP2016/081505.
(Continued)

*Primary Examiner* — Antoinette T Spinks
(74) *Attorney, Agent, or Firm* — Sheridan Ross PC

(57) ABSTRACT

Imaging devices and electronic apparatuses incorporating imaging devices are provided. An imaging device as disclosed can include a first pixel of a first pixel and a second pixel of a second pixel. The first and second pixels each have a first electrode, a portion of a photoelectric conversion film, and a portion of a second electrode, where the photoelectric conversion film is between the first electrode and the second electrode. The first electrode of the first pixel has a first area, while the first electrode of the second pixel has a second area that is smaller than the first area. The first pixel can include
(Continued)

a light shielding film. Alternatively or in addition, the first pixel can be divided into first and second portions.

19 Claims, 21 Drawing Sheets

Related U.S. Application Data continuation of application No. 15/771,170, filed as application No. PCT/JP2016/081505 on Oct. 25, 2016, now Pat. No. 10,469,780.

(56) References Cited

U.S. PATENT DOCUMENTS

| | | |
|---|---|---|
| 6,707,495 B1 | 3/2004 | Harada et al. |
| 10,469,780 B2 | 11/2019 | Hatano et al. |
| 2012/0242874 A1 | 9/2012 | Noudo |
| 2015/0195466 A1 | 7/2015 | Takase et al. |
| 2016/0133865 A1 | 5/2016 | Yamaguchi |
| 2017/0352708 A1 | 12/2017 | Yamaguchi et al. |
| 2018/0240847 A1 | 8/2018 | Ota et al. |
| 2018/0342558 A1 | 11/2018 | Hirata et al. |
| 2019/0206915 A1 | 7/2019 | Kawahito et al. |
| 2020/0021763 A1 | 1/2020 | Hatano et al. |

FOREIGN PATENT DOCUMENTS

| | | |
|---|---|---|
| JP | 2010-181485 | 8/2010 |
| JP | 2011-103335 | 5/2011 |
| JP | 2013-228692 | 11/2013 |
| JP | 2015-050331 | 3/2015 |
| WO | WO 2014/208047 | 12/2014 |
| WO | WO 2015/029425 | 3/2015 |
| WO | WO 2016/072281 | 5/2016 |

OTHER PUBLICATIONS

Official Action for Japanese Patent Application No. 2015-217860, dated Oct. 24, 2019, 4 pages.

\* cited by examiner

SOLID-STATE IMAGING DEVICE AND ELECTRONIC APPARATUS

CROSS REFERENCE TO RELATED APPLICATIONS

This application is a continuation of U.S. patent application Ser. No. 16/585,976, filed Sep. 27, 2019, which is a continuation of U.S. patent application Ser. No. 15/771,170, filed Apr. 26, 2018, now U.S. Pat. No. 10,469,780, which is a national stage application under 35 U.S.C. 371 and claims the benefit of PCT Application No. PCT/JP2016/081505 having an international filing date of Oct. 25, 2016, which designated the United States, which PCT application claimed the benefit of Japanese Priority Patent Application JP 2015-217860 filed on Nov. 5, 2015, the disclosures of each of which are incorporated herein by reference.

TECHNICAL FIELD

The present disclosure relates to a solid-state imaging device and an electronic apparatus and particularly relates to a solid-state imaging device and an electronic apparatus capable of achieving higher sensitivity in imaging characteristics and enhanced autofocus accuracy, in a solid-state imaging device that includes a photoelectric conversion film.

BACKGROUND ART

As a system to implement autofocus of an imaging device such as a digital camera, there is a known pupil-split phase difference detection system that uses an output from a phase difference detection pixel having asymmetric sensitivity with respect to an incident angle of light.

As a technique to implement the pupil-split phase difference detection system on a solid-state imaging device including a photoelectric conversion film, there is a technique disclosed in the prior art in which a solid-state imaging device obtains an image-generation signal on a photoelectric conversion film provided on an upper side of a silicon substrate, and obtains a phase difference detection signal on a photodiode provided within the silicon substrate.

Meanwhile, according to a technique disclosed in the prior art, an upper electrode and a lower electrode are provided so as to sandwich the photoelectric conversion film, and among these, the lower electrode is arranged to be formed in different regions in a pair of pixels, thereby forming a phase difference detection pixel.

CITATION LIST

Patent Literature

[PTL 1]
JP 2011-103335 A
[PTL 2]
JP 2015-050331 A

SUMMARY OF INVENTION

Technical Problem

According to a solid-state imaging device described in the prior art, light incident on the photodiode is light that has been transmitted through the photoelectric conversion film without being absorbed by the photoelectric conversion film. Accordingly, the intensity of the light incident on the photodiode is weak, making it difficult to obtain high autofocus accuracy.

Meanwhile, on a pixel provided for obtaining an ordinary imaging signal, it would be preferable to minimize the area of the lower electrode within a range in which necessary sensitivity output can be obtained. When the area of the lower electrode is large, the lower electrode capacitance is increased, leading to lowered efficiency when the charge is converted to a voltage.

The present disclosure is made in view of this situation to desirably achieve higher sensitivity in imaging characteristics and enhanced autofocus accuracy, on the solid-state imaging device including a photoelectric conversion film.

Solution to Problem

The solid-state imaging device according to an aspect of the present disclosure includes an imaging pixel that includes an upper electrode and a lower electrode that sandwich a photoelectric conversion film and that is used for obtaining an imaging signal, and a phase difference pixel that includes the upper electrode and the lower electrode and that is used to obtain a phase difference detection signal, wherein an area of one of the electrodes that is on an output side of a signal charge and that is divided and provided for each of the pixels among the upper electrode and the lower electrode provided on the phase difference pixel is larger than an area of the one of the electrodes among the upper electrode and the lower electrode provided on the imaging pixel.

In accordance with further embodiments of the present disclosure, a light shielding film is provided to limit incident light above the photoelectric conversion film of the phase difference pixel.

It is possible to configure the one of the electrodes of the phase difference pixel to include a first electrode, a second electrode, and a separating section that separates the first electrode from the second electrode.

The separating section may be configured to pass through the center of the phase difference pixel.

On the phase difference pixel, the area of the first electrode and the area of the second electrode may be configured to be equal.

The separating section may be formed at a position biased with respect to the center of the phase difference pixel.

On the phase difference pixel, the area of first electrode may be configured to be smaller than the area of the second electrode.

The first electrode of the phase difference pixel may be connected to a charge accumulation unit that is formed on a semiconductor substrate and is configured to accumulate a signal charge and output a phase difference signal to the outside.

The second electrode of the phase difference pixel may be connected to a charge discharge unit.

The charge discharge unit may be configured with metal wiring formed between the phase difference pixel and an adjacent pixel.

The charge discharge unit may be configured integrally with the second electrode by using a material same as the material of the first and second electrodes, between the phase difference pixel and the adjacent pixel.

In an aspect of the present disclosure, the area of one of the electrodes that is on an output side of a signal charge and is divided and provided for each of the pixels, among the upper electrode and the lower electrode provided on the phase difference pixel, is larger than the area of the one of the electrodes among the upper electrode and the lower electrode provided on the imaging pixel.

Each of the solid-state imaging device and the electronic apparatus may be an independent device or a module built into another device.

Advantageous Effects of Invention

According to an embodiment of the present disclosure, it is possible to achieve higher sensitivity in imaging characteristics and enhanced autofocus accuracy, on the solid-state imaging device including a photoelectric conversion film.

Note that effects described herein are not limited. The effects may be any effects described in the present disclosure.

DESCRIPTION OF EMBODIMENTS

Hereinafter, embodiments of the present disclosure will be described. Note that description will be in the following order.

1. Exemplary configuration of solid-state imaging device
2. Exemplary pixel structure according to first embodiment (example in which light shielding film is provided on phase difference pixel)
3. Exemplary pixel structure according to second embodiment (first example in which lower electrode of phase difference pixel is divided)
4. Exemplary pixel structure according to third embodiment (example in which both of lower electrodes of phase difference pixel are connected to charge accumulation unit)
5. Exemplary pixel structure according to fourth embodiment (second example in which the lower electrode of the phase difference pixel is divided)
6. Exemplary pixel structure according to fifth embodiment (first example in which charge discharge mechanism is provided)
7. Exemplary pixel structure according to sixth embodiment (second example in which the charge discharge mechanism is provided)
8. Exemplary pixel structure according to seventh embodiment (third example in which charge discharge mechanism is provided)
9. Modification 1. Exemplary Configuration of Solid-State Imaging Device FIG. 1 is a block diagram illustrating an exemplary configuration of a solid-state imaging device.

Figure 1:
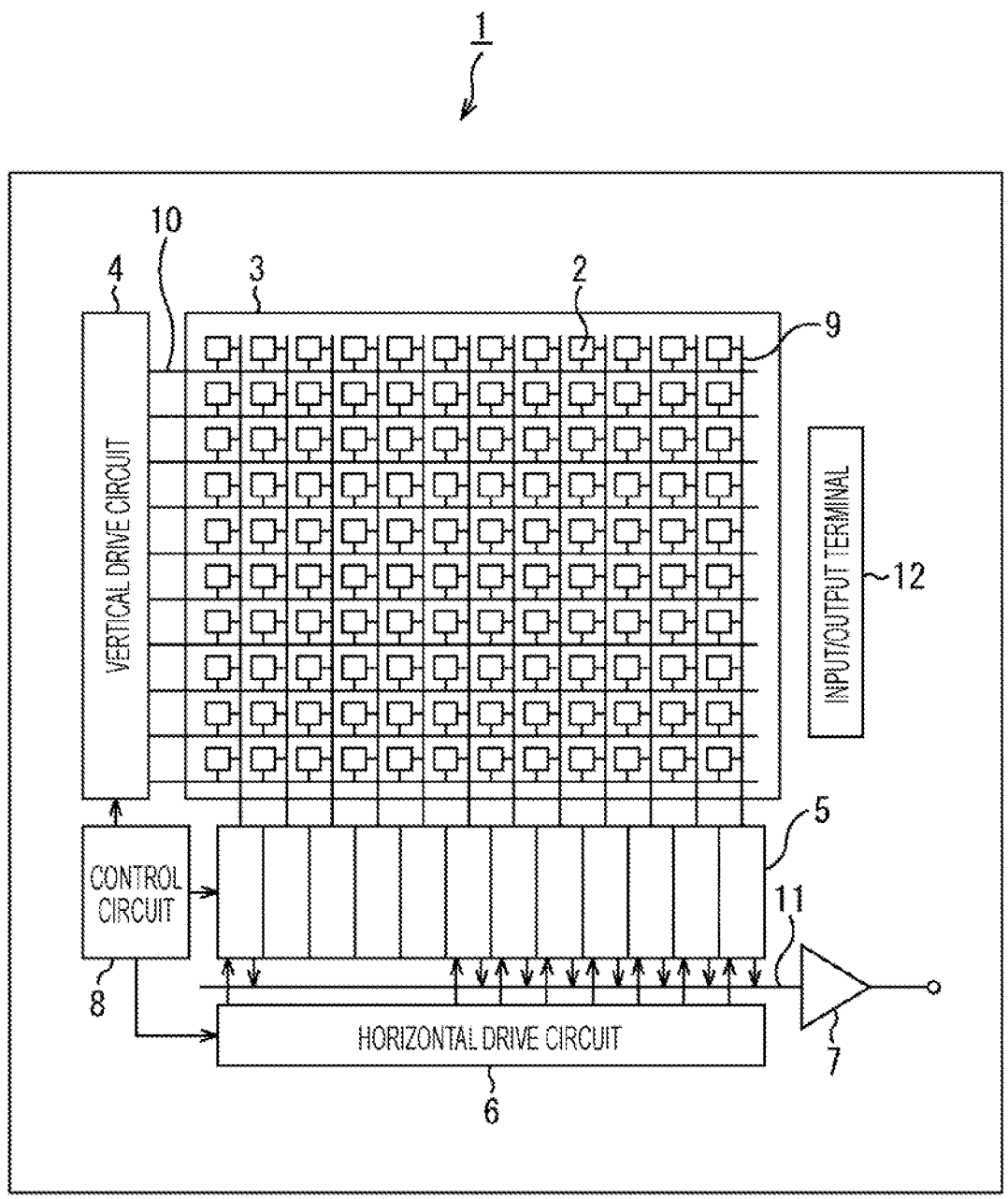
FIG. 1 is a block diagram illustrating an exemplary configuration of a solid-state imaging device.

A solid-state imaging device 1 of FIG. 1 is an imaging device including a photoelectric conversion film. The solid-state imaging device 1 is configured to include a pixel array unit 3 and a peripheral circuit unit formed on a semiconductor substrate that uses, for example, a silicon (Si) as a semiconductor.

The pixel array unit 3 includes pixels 2 two-dimensionally arranged in a matrix. The peripheral circuit unit includes a vertical drive circuit 4, a column signal processing circuit 5, a horizontal drive circuit 6, an output circuit 7, and a control circuit 8.

Each pixel 2 generates and outputs a signal corresponding to the light quantity of the incident light. The signal output from a pixel 2 includes a signal obtained by performing photoelectric conversion on a photoelectric conversion film.

As illustrated below with reference to FIG. 2, or the like, the pixels 2 include an imaging pixel 2X and a phase difference pixel 2P. The imaging pixel 2X is used to obtain an image generation signal. The phase difference pixel 2P is used to obtain a phase difference detection signal. At least a portion of the pixels 2 within the pixel array unit 3 correspond to the phase difference pixel 2P.

Hereinafter, an image generation signal output from the imaging pixel 2X will be referred to as an imaging signal and a phase difference detection signal output from the phase difference pixel 2P will be referred to as a phase difference signal, appropriately.

Each pixel 2 can include a photoelectric conversion unit that uses a photodiode and a photoelectric conversion film, and a plurality of pixel transistors (also referred to as MOS transistors). Examples of the plurality of pixel transistors include four types of MOS transistors, namely, a transfer transistor, a selection transistor, a reset transistor, and an amplification transistor.

On the basis of a vertical synchronizing signal, a horizontal synchronizing signal, and a master clock, the control circuit 8 generates a clock signal and a control signal to be a standard of operation of the vertical drive circuit 4, the column signal processing circuit 5, and the horizontal drive circuit 6, and outputs the signals to individual sections.

The vertical drive circuit 4 includes, for example, a shift register. The vertical drive circuit 4 selects pixel drive wiring 10 and supplies a pulse to drive the pixel 2 to the selected pixel drive wiring 10, thereby driving the pixel 2 in a unit of line. Specifically, the vertical drive circuit 4 selectively scans the pixels 2 of the pixel array unit 3 sequentially in a unit of line, in the vertical direction, and allows the image signal generated at each of the pixels 2 corresponding to the light receiving quantity to be supplied to the column signal processing circuit 5 via a vertical signal line 9.

The column signal processing circuit 5 is arranged for each of the columns of pixels 2. Each of the column signal processing circuits 5 performs, for each of the pixel lines, signal processing such as noise reduction with respect to the pixel signals, as targets, output from the pixels 2 in one line. For example, the column signal processing circuit 5 performs signal processing such as correlated double sampling (CDS) to reduce a pixel-specific fixed pattern noise and AD conversion.

The horizontal drive circuit 6 includes, for example, a shift register. The horizontal drive circuit 6 sequentially selects each of the column signal processing circuits 5 by sequentially outputting horizontal scan pulses, and causes each of the column signal processing circuits 5 to output a pixel signal to a horizontal signal line 11.

The output circuit 7 performs signal processing of the pixel signals sequentially supplied from each of the column signal processing circuits 5 via the horizontal signal line 11, and outputs the processed signals. The output circuit 7 performs signal processing such as buffering, black level adjustment, and column variation correction. An input/output terminal 12 performs signal transmission with the outside.

The above-configured solid-state imaging device 1 is a CMOS image sensor referred to as a column AD system in which the column signal processing circuit 5 that performs CDS processing and AD conversion processing is arranged at each of the pixel columns.

2. Exemplary Pixel Structure According to First Embodiment

Figure 2:
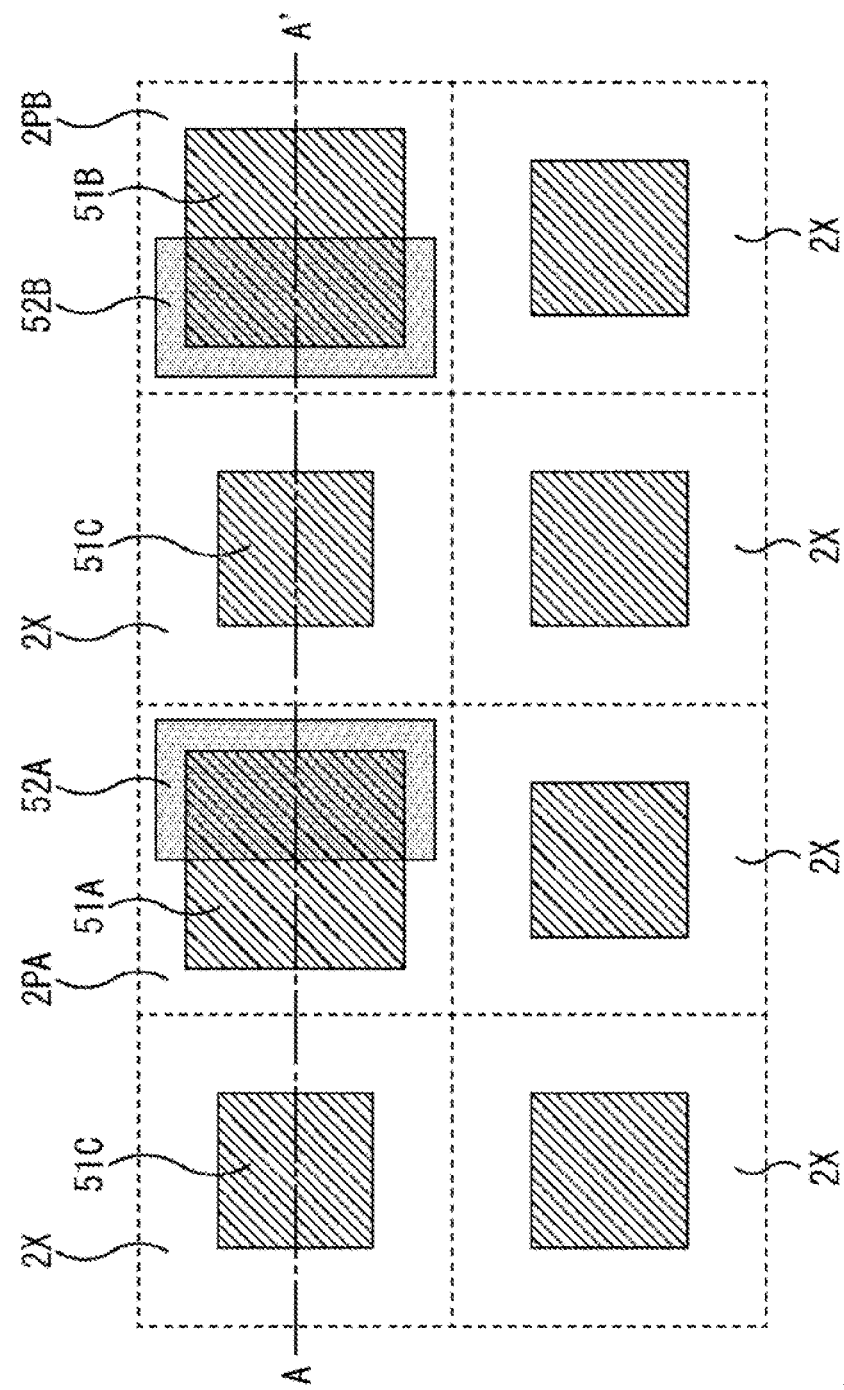
FIG. 2 is a plan view illustrating a form of a lower electrode according to a first embodiment.

FIG. 2 is a plan view illustrating a form of a lower electrode of a solid-state imaging device 1 according to a first embodiment.

As described in detail below, a photoelectric conversion film of each of the pixels 2 is arranged to be sandwiched between an upper electrode and a lower electrode. FIG. 2 illustrates a configuration of a lower electrode layer and a light shielding film layer provided on the lower electrode layer in a plan view.

FIG. 2 illustrates an eight-pixel portion including 2 lines×4 columns among the pixels 2 included in the pixel array unit 3. Broken lines illustrated in FIG. 2 indicate boundaries between the pixels 2. Configurations similar to the configuration illustrated in FIG. 2 are provided in individual sections of the pixel array unit 3.

On the first line from the top in FIG. 2, imaging pixels 2X and phase difference pixels 2P are arranged alternately. A phase difference pixel 2PA and a phase difference pixel 2PB arranged in the left and right of the imaging pixel 2X to sandwich the imaging pixel 2X are a pair of phase difference pixels 2P used to compare a phase difference. On the second line, four imaging pixels 2X are arranged. Note that the arrangement of the pixels 2 included in the pixel array unit 3 is not limited to the example illustrated in FIG. 2. For example, the phase difference pixel 2PA and the phase difference pixel 2PB may be arranged to be adjacent to each other.

A substantially square lower electrode 51A is provided on the phase difference pixel 2PA. The lower electrode 51A is arranged such that its center position corresponds to the center position of the phase difference pixel 2PA (optical axis position of an on-chip lens provided on the pixel). Similarly, the substantially square lower electrode 51B is provided on the phase difference pixel 2PB. The lower electrode 51B is arranged such that its center position corresponds to the center position of the phase difference pixel 2PB.

A light shielding film 52A is provided so as to cover substantially all of the right half of the phase difference pixel 2PA except for a surrounding small-width portion on the phase difference pixel 2PA. In addition, a light shielding film 52B is provided so as to cover substantially all of the left half of the lower electrode 51B, except for a surrounding small-width portion on the phase difference pixel 2PB.

Meanwhile, a substantially square lower electrode 51C is provided on the imaging pixel 2X. The lower electrode 51C is arranged such that the position of the center of the lower electrode 51C corresponds to the center position of the imaging pixel 2X.

In this manner, the lower electrodes are provided on the phase difference pixel 2P and the imaging pixel 2X separately for each of the pixels, although in a plan view the areas of the lower electrodes are different from each other. Specifically, the area of the lower electrode provided on a phase difference pixel 2P is larger than the area of the lower electrode provided on an imaging pixel 2X.

Hereinafter, in a case where no distinction is needed, a lower electrode 51A provided on a phase difference pixel 2PA, a lower electrode 51B provided on a phase difference pixel 2PB, and a lower electrode 51C provided on the imaging pixel 2X will be collectively referred to as a lower electrode 51, appropriately.

Figure 3:
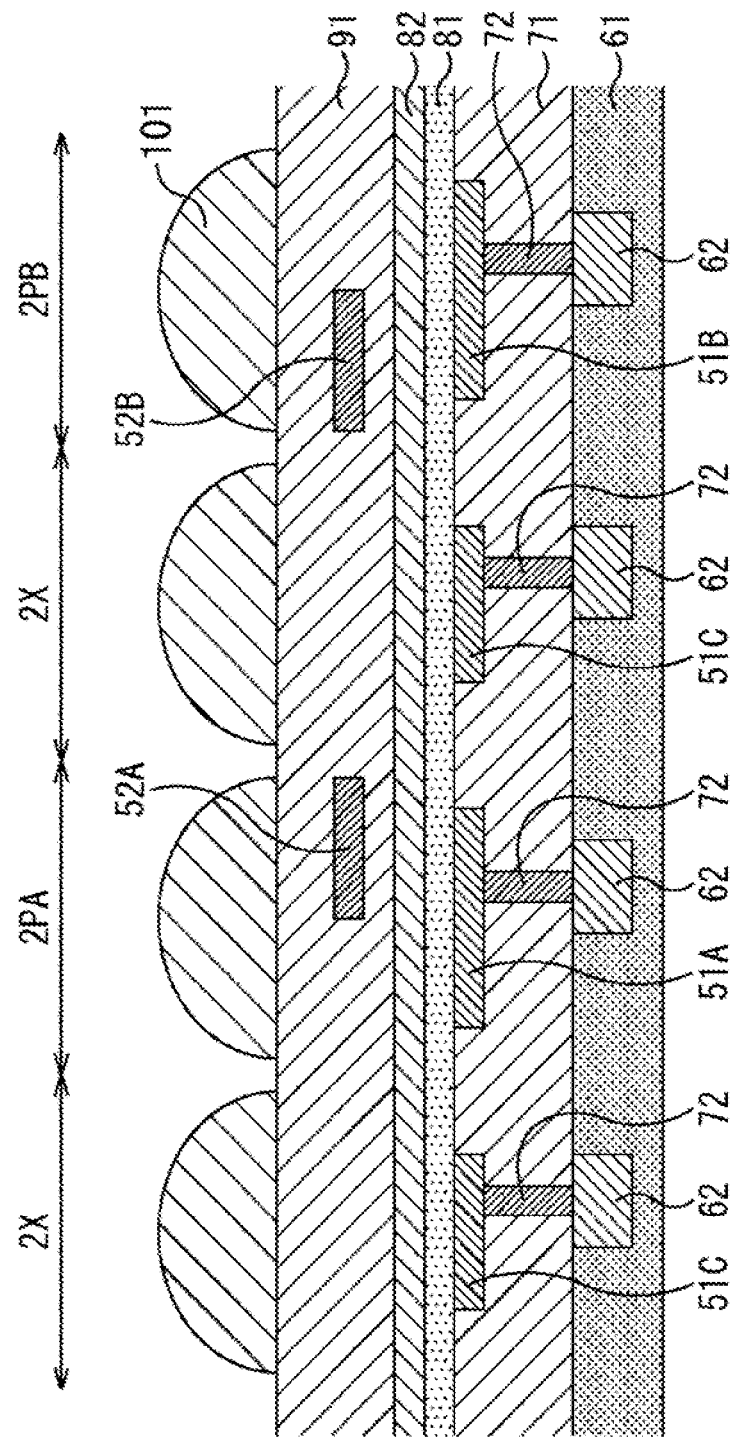
FIG. 3 is a cross-sectional view illustrating a structure of a pixel according to the first embodiment.

FIG. 3 is a cross-sectional view illustrating a pixel structure taken along line A-A' in FIG. 2.

As illustrated in FIG. 3, the pixels 2 include a semiconductor substrate 61, a transparent insulating film 71, a lower electrode 51, a photoelectric conversion film 81, an upper electrode 82, an interlayer insulating film 91, and an on-chip lens 101, stacked in this order from the bottom.

A charge accumulation unit 62 formed with a semiconductor region of a second conduction type (e.g. n-type) is provided on a semiconductor substrate 61 of a first conduction type (e.g. p-type).

Above the semiconductor substrate 61, the upper electrode 82 and the lower electrode 51 are arranged so as to sandwich the photoelectric conversion film 81. The upper electrode 82 is arranged over a whole surface of the pixel array unit 3, across the plurality of pixels 2. Meanwhile, the lower electrode 51 is divided and arranged for each of the pixels. As illustrated in FIG. 3, the lower electrode 51A of the phase difference pixel 2PA and the lower electrode 51B of the phase difference pixel 2PB each has an area larger than an area of the lower electrode 51C of the imaging pixel 2X.

The lower electrode 51 is connected to the charge accumulation unit 62 via metal wiring 72 as a charge transfer means. The signal charge obtained by the photoelectric conversion performed on the photoelectric conversion film 81 is collected onto the lower electrode 51, transferred to the charge accumulation unit 62 and accumulated.

A light shielding film 52A is formed within the interlayer insulating film 91 of a phase difference pixel 2PA and a light shielding film 52B is formed within the interlayer insulating film 91 of a phase difference pixel 2PB. By forming the light shielding films in different regions on the phase difference pixel 2PA and on the phase difference pixel 2PB, incident angle characteristics of the sensitivity of each of the pixels also differ from each other. The signals output from the phase difference pixel 2PA and the phase difference pixel 2PB correspond to phase difference signals representing a phase difference of an object.

By decreasing the area of the lower electrode of the imaging pixel 2X, it is possible to reduce the capacitance of the lower electrode, and thus, reduce the capacitance of the charge accumulation unit 62 connected with the lower electrode. Viewed from the output side, it is possible to assume, electrically, the capacitance of the lower electrode as capacitance integrated with the capacitance of the charge accumulation unit 62.

As a result of reducing the capacitance of the charge accumulation unit 62, it is possible to enhance conversion efficiency from charge to voltage, that is, to enhance sensitivity of the imaging pixel 2X to incident light.

Figure 4:
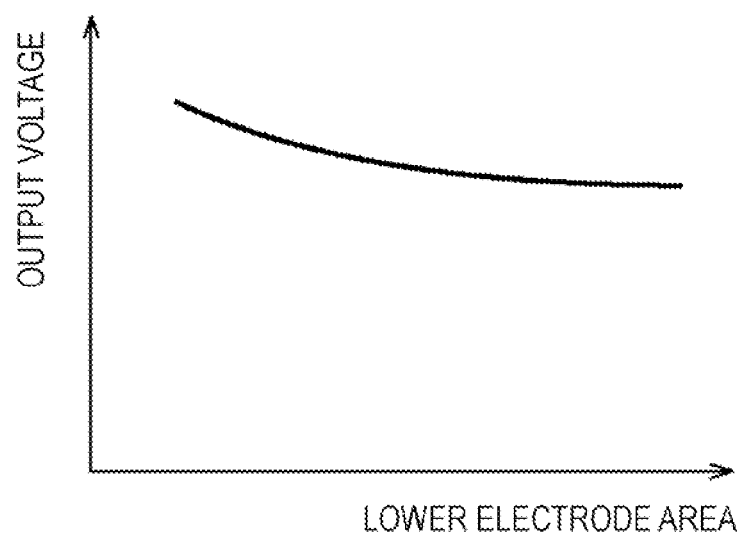
FIG. 4 is a diagram illustrating an area of a lower electrode and an output voltage characteristic.

FIG. 4 is a diagram illustrating an output voltage characteristic with respect to the area of the lower electrode.

In FIG. 4, the horizontal axis in the graph represents the area of the lower electrode and the vertical axis represents the output voltage. As illustrated in FIG. 4, the output voltage is inversely proportional to the capacitance. Accordingly, the larger the area of the lower electrode and thus the larger the capacitance of the charge accumulation unit, the lower the output voltage. In short, by reducing the area of the lower electrode, it is possible to enhance the conversion efficiency from the charge to the voltage. The size of the lower electrode of the imaging pixel 2X is preferably as small as possible as long as necessary output sensitivity can be obtained.

On the other hand, by increasing the area of the lower electrode of the phase difference pixel 2P, a light-condensing spot is not easily displaced from a region of the lower electrode even when the incident angle of light is great, making it possible to enhance sensitivity to light with a large incident angle. With enhanced sensitivity toward incident light from an oblique direction, it is possible to increase the sensitivity difference between the pair of phase difference pixels 2P, in particular when the incident angle is large, and thus, to enhance the accuracy with which a phase difference is detected.

Figure 5:
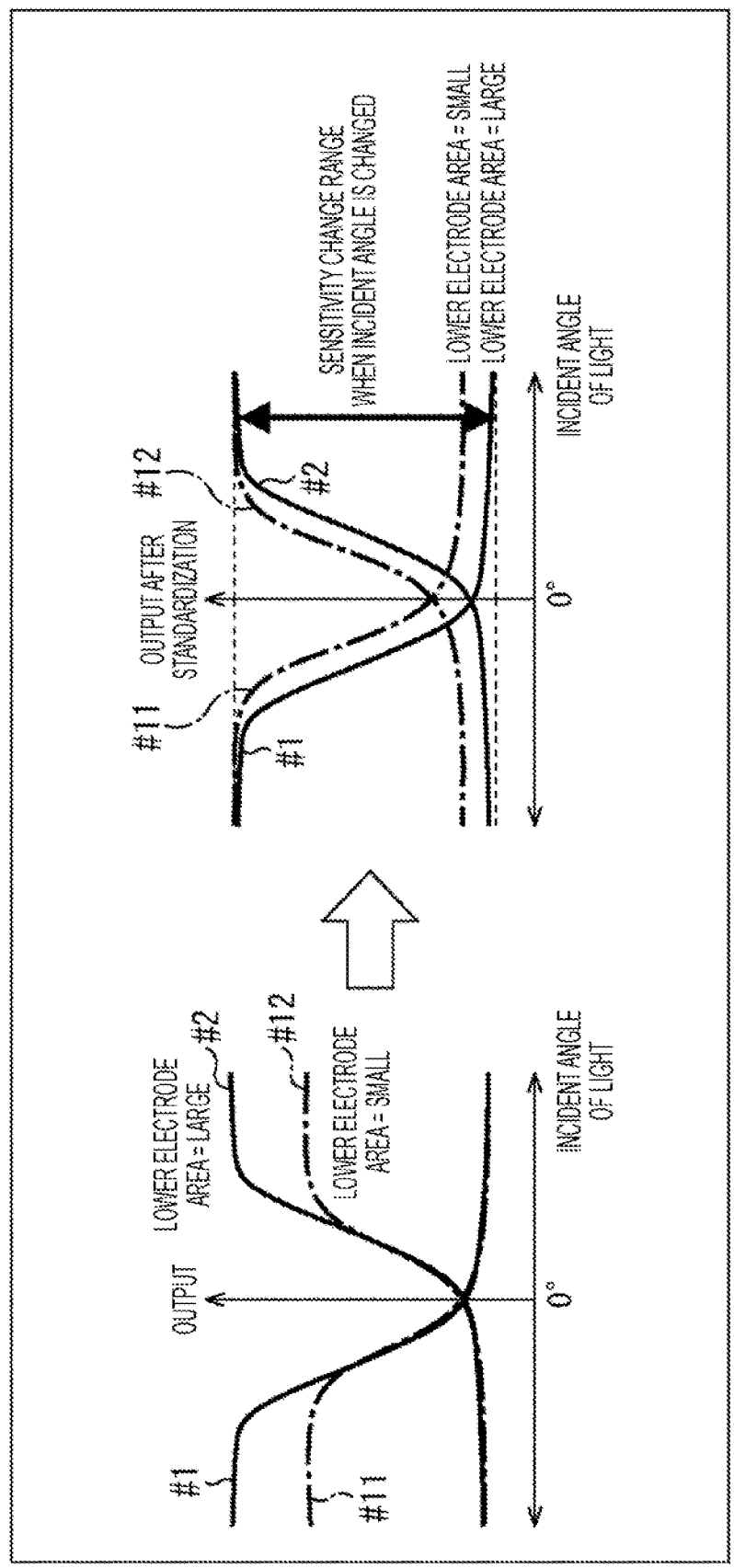
FIG. 5 is a diagram illustrating an output voltage characteristic with respect to an incident angle of light.

FIG. 5 is a diagram illustrating an exemplary output voltage characteristic with respect to an incident angle of light.

In a graph on the left side in FIG. 5, the horizontal axis represents the incident angle of light, and the vertical axis represents the output voltage. Among the pair of phase difference pixels 2P, curved lines #1 and #11 represent characteristics of one phase difference pixel 2P having sensitivity toward the light with an incident angle in the negative direction, and curved lines #2 and #12 represent characteristics of the other phase difference pixel 2P having sensitivity toward the light with an incident angle in the positive direction.

The solid curved lines #1 and #2 represent output voltages when the area of the lower electrode is large, and one-dot-chained curved lines #11 and #12 represent output voltages when the area of the lower electrode is small.

The graph on the right of the open arrow indicates output characteristics after standardization. On a signal processing unit outside of the solid-state imaging device 1, processing to standardize a phase difference signal output from the phase difference pixel 2P is performed, and then, the phase difference is detected on the basis of the standardized signal.

As illustrated in the graph on the right in FIG. 5, in a case where an incident angle of light is a certain level or more in the negative direction, the output voltage difference when the area of the lower electrode is large, represented as a difference between curved lines #1 and #2, is greater than the output voltage difference when the area of the lower electrode is small, represented as a difference between curved lines #11 and #12. Additionally, in a case where an incident angle of light is a certain level or more incident angle exists in the positive direction, the output voltage difference when the area of the lower electrode is large, represented as a difference between curved lines #1 and #2, is greater than the output voltage difference when the area of the lower electrode is small, represented as a difference between curved lines #11 and #12.

By increasing the area of the lower electrode, it is possible to increase the output difference between the pair of pixels, namely, the phase difference pixels 2P when the incident angle of light is large. The capability of increasing the output difference between the pair of phase difference pixels 2P leads to a possibility to enhance phase difference detection accuracy, namely, autofocus accuracy.

In this manner, by increasing the area of the lower electrode of the phase difference pixel 2P to be relatively larger than the area of the lower electrode of the imaging pixel 2X, it is possible to enhance sensitivity of the imaging pixel 2X and enhance autofocus accuracy.

Note that in view of characteristics, the percentage of the area of the lower electrode with respect to the area of the imaging pixel 2X is preferably 30% or below. In addition, the percentage of the area of the lower electrode with respect to the area of the phase difference pixel 2P is preferably 50% or above.

Details of the cross-sectional structure described with reference to FIG. 3 will be described. The structure of the imaging pixel 2X will be described first, and thereafter, structures of the phase difference pixel 2PA and the phase difference pixel 2PB will be described focusing on the difference from the structure of the imaging pixel 2X.

A photodiode with a p-n junction is formed (not illustrated) on the semiconductor substrate 61 of the imaging pixel 2X by stacking semiconductor regions of the second conduction type, in the depth direction. For example, the photodiode formed on a side closer to the back-side (upper side in the figure) receives blue light and performs photoelectric conversion, and the photodiode formed on a side closer to the front-side (lower side in the figure) receives red light and performs photoelectric conversion.

A pixel transistor that performs operations such as reading of the charge accumulated in the photodiode, a wiring layer, or the like, are formed on the front-side of the semiconductor substrate 61.

The transparent insulating film 71 formed on the back-side of the semiconductor substrate 61 includes a two-layer or a three-layer film, or the like, of a hafnium oxide ($HfO_2$) film and a silicon oxide film, for example.

The photoelectric conversion film 81 sandwiched between the upper electrode 82 on the upper side and the lower electrode 51C is provided above the transparent insulating film 71. The photoelectric conversion film 81, the upper electrode 82, and the lower electrode 51C form a photoelectric conversion unit.

The photoelectric conversion film 81 includes, for example, when used as a film that performs photoelectric conversion of light of green wavelength, organic photoelectric conversion materials including rhodamine-based pigments, merocyanine-based pigments, and quinacridone. The upper electrode 82 and the lower electrode 51C are formed of transparent electrode films such as an indium tin oxide (ITO) film and an indium zinc oxide film.

Note that when used as a film that performs photoelectric conversion of red light, the photoelectric conversion film 81 may use, for example, organic photoelectric conversion materials including phthalocyanine-based pigments as a material of the photoelectric conversion film 81. In addition, when the photoelectric conversion film 81 is used as a film that performs photoelectric conversion of blue light, the photoelectric conversion film 81 may use organic photoelectric conversion materials including coumarin-based pigments, tris-8-hydroxyquinoline-Al (Alq3), and merocyanine-based pigments.

The lower electrode 51C formed for each of the imaging pixels is connected to the charge accumulation unit 62 via the metal wiring 72 penetrating through the transparent insulating film 71. The metal wiring 72 is formed of a material such as tungsten (W), aluminum (Al), and copper (Cu).

On an upper surface of the upper electrode 82, the interlayer insulating film 91 is formed with an inorganic membrane including silicon nitride (SiN), silicon oxynitride (SiON), silicon carbide (SiC), or the like. The on-chip lens 101 is formed above the interlayer insulating film 91. Examples of materials of the on-chip lens 101 include silicon nitride (SiN), or resin-based materials such as styrenic resin, acrylic resin, styrene-acrylic copolymer resin, or siloxane based resin.

When the surface that includes pixel transistors is defined as a front-side of the semiconductor substrate 61, the above-structured solid-state imaging device 1 corresponds to a back-illuminated CMOS solid-state imaging device, with light entering from the back-side.

In addition, the solid-state imaging device 1 performs photoelectric conversion of green light on the photoelectric conversion film 81 and performs photoelectric conversion of blue and red light on a photodiode within the semiconductor substrate 61, and thus, functions as a longitudinal spectroscopic solid-state imaging device.

The phase difference pixel 2P has a pixel structure equal to the structure of the imaging pixel 2X except that, as described above, the phase difference pixel 2P has a lower electrode area that is different from the case of the imaging pixel 2X, and that the light shielding film is included to cover a partial region of the pixel.

3. Exemplary Pixel Structure According to Second Embodiment

Figure 6:
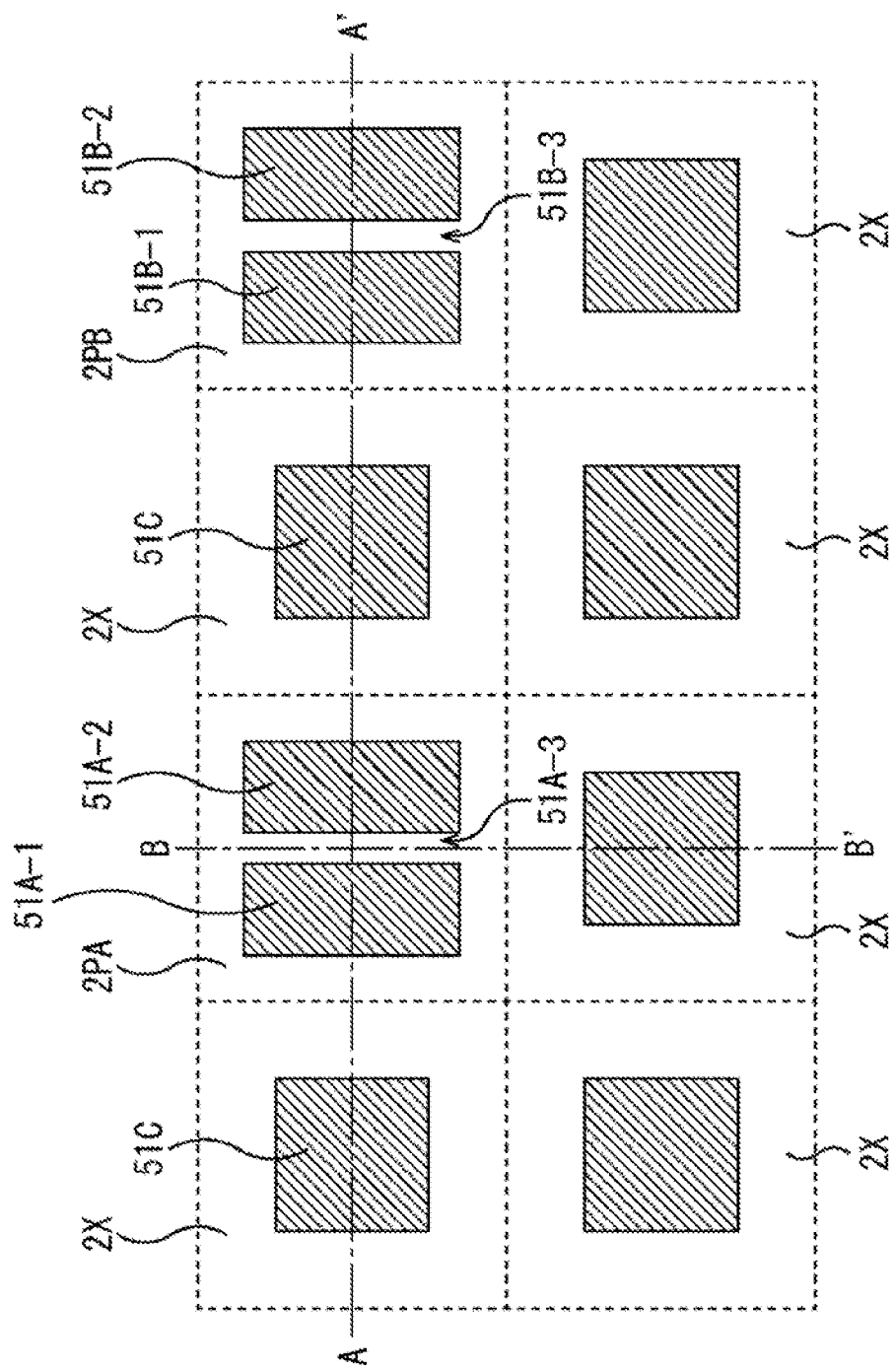
FIG. 6 is a plan view illustrating a form of a lower electrode according to a second embodiment.

FIG. 6 is a plan view illustrating a form of a lower electrode of the solid-state imaging device 1 according to a second embodiment.

Among the components illustrated in FIG. 6, the component corresponding to the above-described component is provided with a same reference sign. Overlapping description will be appropriately omitted. The configuration illustrated in FIG. 6 differs from the configuration illustrated in FIG. 2, mainly in that the lower electrodes of the phase difference pixels 2P are divided into two parts arranged in the horizontal direction, and that there is no light shielding film to cover the phase difference pixel 2P.

As illustrated in FIG. 6, the lower electrode of the phase difference pixel 2PA includes a lower electrode 51A-1, a lower electrode 51A-2, and a lower electrode separating section 51A-3. The lower electrode separating section 51A-3 is a region that passes through the center of the phase difference pixel 2PA and is provided between the lower electrode 51A-1 and the lower electrode 51A-2.

The lower electrode 51A-1 and the lower electrode 51A-2 are formed at positions substantially symmetrical with respect to a vertical axis represented by line B-B', passing through the center of the phase difference pixel 2PA. The area of the lower electrode 51A-1 in a plan view is substantially equal to the area of the lower electrode 51A-2 in the plan view. There is no light shielding film on the phase difference pixel 2PA.

Similarly, the lower electrode of the phase difference pixel 2PB includes a lower electrode 51B-1, a lower electrode 51B-2, and a lower electrode separating section 51B-3. The lower electrode separating section 51B-3 is a region that passes through the center of the phase difference pixel 2PB and that is provided between the lower electrode 51B-1 and the lower electrode 51B-2.

The lower electrode 51B-1 and the lower electrode 51B-2 are formed at positions substantially symmetrical with respect to a vertical axis passing through the center of the phase difference pixel 2PB. Similarly, there is no light shielding film on the phase difference pixel 2PB.

Figure 7:
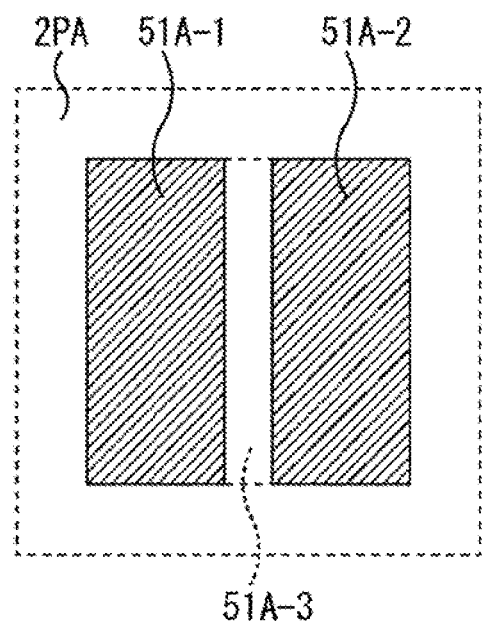
FIG. 7 is an enlarged view of the lower electrode of a phase difference pixel in FIG. 6.

FIG. 7 is an enlarged view of the lower electrode of the phase difference pixel 2PA.

As illustrated in FIG. 7, each of the lower electrode 51A-1 and the lower electrode 51A-2 has a substantially vertically-long rectangular form. The length of each of the lower electrode 51A-1 and the lower electrode 51A-2 in the vertical direction is longer than the length of the lower electrode 51C formed on the imaging pixel 2X, in the vertical direction. The lower electrode separating section 51A-3 that is represented by the broken lines and has a small width is formed between the lower electrode 51A-1 and the lower electrode 51A-2.

Figure 8:
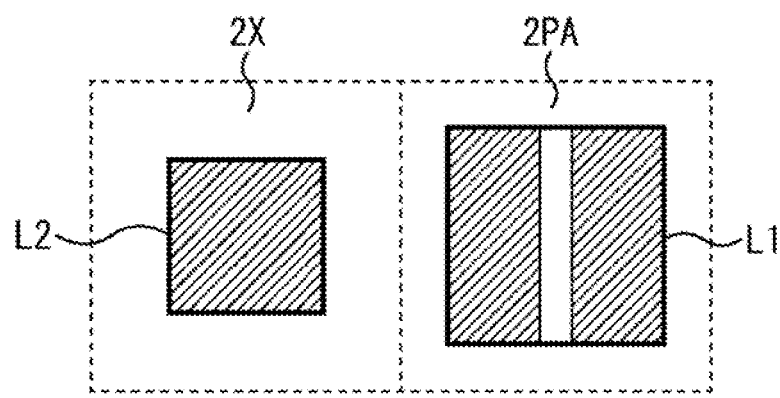
FIG. 8 is a diagram illustrating a lower electrode of an imaging pixel and a lower electrode of a phase difference pixel.

A region enclosed in a bold line L1 in FIG. 8, formed by combining three regions of the lower electrode 51A-1, the lower electrode 51A-2, and the lower electrode separating section 51A-3, corresponds to the region of the lower electrode 51A in FIG. 2, for example. The center position of the substantially square region enclosed by the bold line L1 matches with the substantially center position of the phase difference pixel 2PA.

When the lower electrode separating section 51A-3 is assumed to be included in a lower electrode region, the area in a plan view of the lower electrode formed on the phase difference pixel 2PA, namely, the area of the region enclosed by the bold line L1, is larger than the area in the plan view of the lower electrode 51C formed on the imaging pixel 2X, namely, the area of the region enclosed by the bold line L2. This is also applicable to the lower electrode formed on the phase difference pixel 2PB.

Figure 9:
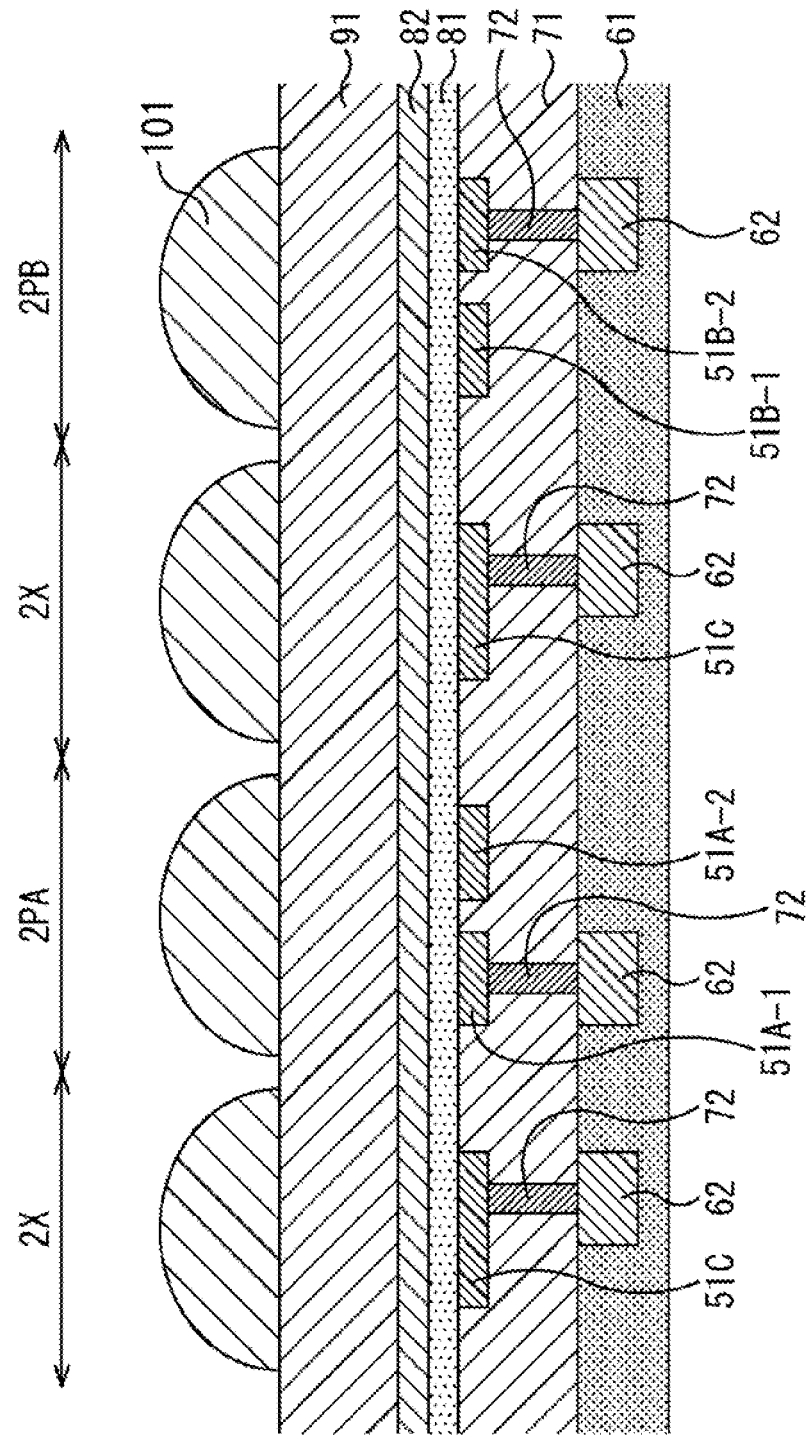
FIG. 9 is a cross-sectional view illustrating a structure of a pixel according to the second embodiment.

FIG. 9 is a cross-sectional view illustrating a pixel structure taken along line A-A' in FIG. 6.

Among the components illustrated in FIG. 9, the component corresponding to the above-described component is provided with a same reference sign. Overlapping description will be appropriately omitted. The charge accumulation unit 62 is formed in the semiconductor substrate 61 of each of the pixels.

Among the lower electrode 51A-1 and the lower electrode 51A-2, on the phase difference pixel 2PA, the lower electrode 51A-1 is connected to the charge accumulation unit 62 via the metal wiring 72. In contrast, the lower electrode 51A-2 is not connected to the charge accumulation unit 62. Among the signal charges obtained by photoelectric conversion performed on the photoelectric conversion film 81 of the phase difference pixel 2PA, the signal charge collected by the lower electrode 51A-1 is accumulated onto the charge accumulation unit 62.

Among the lower electrode 51B-1 and the lower electrode 51B-2, on the phase difference pixel 2PB, the lower electrode 51B-2 is connected to the charge accumulation unit 62 via the metal wiring 72. In contrast, the lower electrode 51B-1 is not connected to the charge accumulation unit 62. Among the signal charges obtained by photoelectric conversion performed on the photoelectric conversion film 81 of the phase difference pixel 2PB, the signal charge collected by the lower electrode 51B-2 is accumulated onto the charge accumulation unit 62.

In this manner, on the phase difference pixel 2P in FIG. 9, among the lower electrodes divided and arranged within a same pixel, the lower electrode connected to the charge accumulation unit 62 are left-right inverted between the phase difference pixel 2PA and the phase difference pixel 2PB.

Among the lower electrode 51A-1 and the lower electrode 51A-2, on the phase difference pixel 2PA, the lower electrode that contributes to charge output is the lower electrode 51A-1 formed on the left side of the vertical axis passing through the center of the phase difference pixel 2PA in a plan view. Similarly, among the lower electrode 51B-1 and the lower electrode 51B-2, on the phase difference pixel 2PB, the lower electrode that contributes to charge output is the lower electrode 51B-2 formed on the right side of the vertical axis passing through the center of the phase difference pixel 2PB in a plan view.

Since the lower electrodes that contribute to charge output are arranged to be formed in different regions, it is possible to obtain incident angle characteristics of the sensitivity, that differ in the pixel pair of the phase difference pixel 2PA and the phase difference pixel 2PB. As a result, it is possible to obtain a phase difference signal without providing a light shielding film.

On the other hand, by increasing the area (area enclosed by the bold line L1 in FIG. 8) of the lower electrode of the phase difference pixel 2P, a light-condensing spot is not easily displaced from the lower electrode region, making it possible to enhance sensitivity toward the light with a large incident angle. With enhanced sensitivity toward the incident light from an oblique direction, it is possible to increase the sensitivity difference between the pair of phase difference pixels 2P, when the incident angle is large in particular, and thus, to enhance accuracy to detect phase difference.

As a result of suppressing the area of the lower electrode 51C of the imaging pixel 2X, and reducing the capacitance of the charge accumulation unit 62, it is possible to enhance sensitivity of the imaging pixel 2X.

Note that the area of each of the lower electrodes 51A-1 and 51B-2 that contribute to charge output may be arranged to be substantially the same as the area of the lower electrode 51C. With this arrangement, it is possible to set the level of the phase difference signal output from the phase difference pixel 2 and the level of the imaging signal output from the imaging pixel 2X, when the same amount of light is incident, to substantially a same level. Accordingly, it is possible to facilitate signal processing performed on a later-stage circuit.

4. Exemplary Pixel Structure According to Third Embodiment

Figure 10:
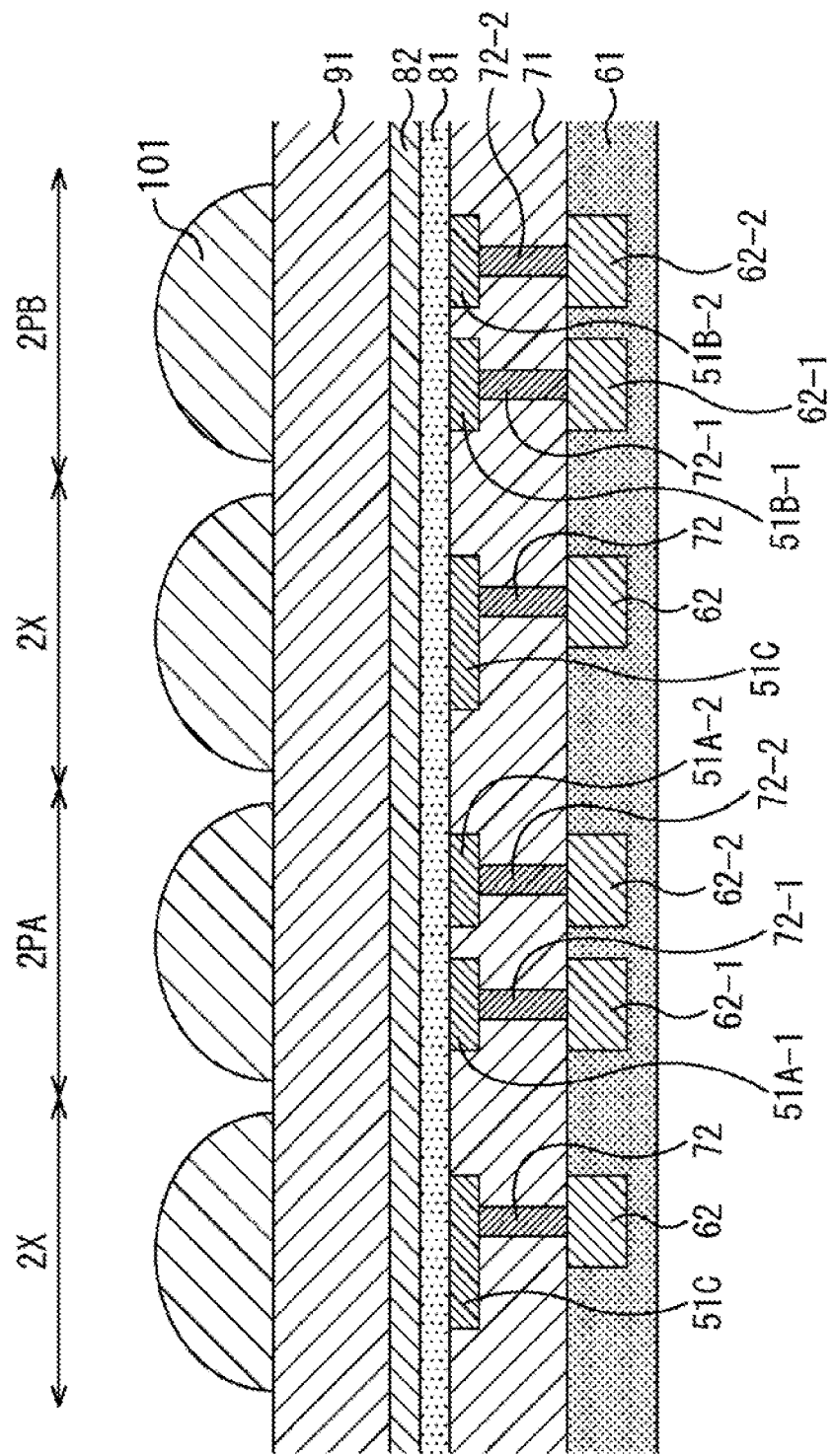
FIG. 10 is a cross-sectional view illustrating a structure of a pixel according to a third embodiment.

FIG. 10 is a cross-sectional view illustrating a pixel structure of the solid-state imaging device 1 according to a third embodiment.

The configuration in a plan view is the same as the configuration in FIG. 6. FIG. 10 illustrates a pixel structure taken along line A-A' in FIG. 6.

The structure illustrated in FIG. 10 differs from the structure in FIG. 9 in that not only the lower electrode 51A-1 but also the lower electrode 51A-2, of the phase difference pixel 2PA, is connected to the charge accumulation unit 62 and that not only the lower electrode 51B-2 but also the lower electrode 51B-1, of the phase difference pixel 2PB, is connected to the charge accumulation unit 62.

The lower electrode 51A-1 of the phase difference pixel 2PA is connected to a charge accumulation unit 62-1 via metal wiring 72-1. In addition, the lower electrode 51A-2 is connected to a charge accumulation unit 62-2 via metal wiring 72-2.

Among the signal charges obtained by photoelectric conversion performed on the phase difference pixel 2PA, the signal charge collected by the lower electrode 51A-1 is accumulated onto the charge accumulation unit 62-1, and the signal charge collected by the lower electrode 51A-2 is accumulated onto the charge accumulation unit 62-2.

Meanwhile, the lower electrode 51B-1 of the phase difference pixel 2PB is connected to the charge accumulation unit 62-1 via the metal wiring 72-1. The lower electrode 51B-2 is connected to the charge accumulation unit 62-2 via the metal wiring 72-2.

Among the signal charges obtained by photoelectric conversion performed on the phase difference pixel 2PB, the signal charge collected by the lower electrode 51B-1 is accumulated onto the charge accumulation unit 62-1, and the signal charge collected by the lower electrode 51B-2 is accumulated onto the charge accumulation unit 62-2.

In this manner, although on the phase difference pixel 2P in FIG. 10, the lower electrodes divided and arranged within a same pixel are connected to the charge accumulation unit 62, the lower electrodes that supply phase difference signals used for phase difference detection are not the same.

Specifically, the phase difference pixel 2PA outputs a signal corresponding to the signal charge collected by the lower electrode 51A-1 and accumulated in the charge accumulation unit 62-1, and outputs a signal corresponding to the signal charge collected by the lower electrode 51A-2 and accumulated in the charge accumulation unit 62-2. However, the latter signal, for example, is not used for phase difference detection.

The signal corresponding to the signal charge accumulated in the charge accumulation unit 62-2 of the phase difference pixel 2PA is discarded at a circuit provided outside the solid-state imaging device 1, for example, the circuit that performs phase difference detection in the later stage. Alternatively, it is allowable to configure such that the signal charge accumulated in the charge accumulation unit 62-2 is discarded within the solid-state imaging device 1.

Similarly, the phase difference pixel 2PB outputs a signal corresponding to the signal charge collected by the lower electrode 51B-1 and accumulated in the charge accumulation unit 62-1, and outputs a signal corresponding to the signal charge collected by the lower electrode 51B-2 and accumulated in the charge accumulation unit 62-2. However, the former signal, for example, is not used for phase difference detection.

The signal corresponding to the signal charge accumulated in the charge accumulation unit 62-1 of the phase difference pixel 2PB is discarded at a circuit that performs phase difference detection in the later stage, for example. Alternatively, it is allowable to configure such that the signal charge accumulated in the charge accumulation unit 62-1 is discarded within the solid-state imaging device 1.

The lower electrodes used for phase difference detection are left-right inverted between the phase difference pixel 2PA and the phase difference pixel 2PB. The lower electrode used for phase difference detection on the phase difference pixel 2PA is the lower electrode 51A-1 formed on the left side of the phase difference pixel 2PA, and the lower electrode used for phase difference detection on the phase difference pixel 2PB is the lower electrode 51B-2 formed on the right side of the phase difference pixel 2PB.

Since the lower electrodes that contribute to phase difference detection are arranged to be formed in different regions, it is possible to obtain incident angle characteristics of the sensitivity, that differ in the pixel pair of the phase difference pixel 2PA and the phase difference pixel 2PB. As a result, it is possible to obtain a phase difference signal.

With this arrangement, similarly to a case where the structure illustrated in FIG. 9 according the second embodiment is employed, it is possible to enhance sensitivity to the light with a large incident angle and to enhance accuracy to detect a phase difference.

Moreover, since it is possible to discharge the signal charge collected by the lower electrode that is not used for phase difference detection, onto the charge accumulation unit, stable output of the phase difference signal can be achieved. For example, if the signal charge collected by the lower electrode 51A-2 of the phase difference pixel 2PA was not discharged to the charge accumulation unit, capacitive coupling might occur and potential variation in the lower electrode 51A-2 might cause potential variation in the adjacent lower electrode 51A-1. However, with the above-described arrangement, it is possible to suppress such variation. In some cases, a leakage current might occur between the lower electrode 51A-2 that has collected signal charge, and the upper electrode 82. Even in this case, it is possible to prevent occurrence of such a leakage current.

5. Exemplary Pixel Structure According to Fourth Embodiment

Figure 11:
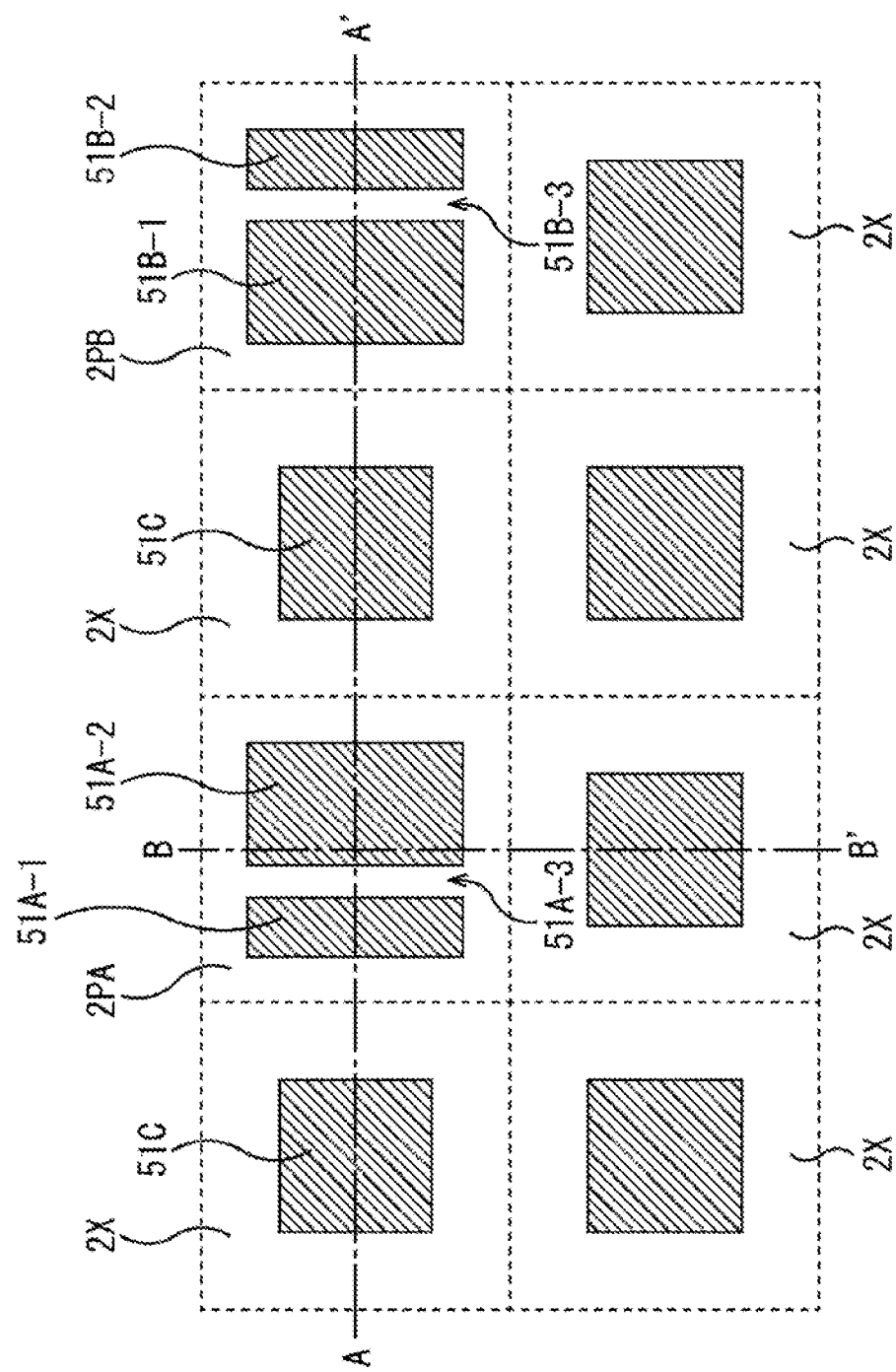
FIG. 11 is a plan view illustrating a form of a lower electrode according to a fourth embodiment.

FIG. 11 is a plan view illustrating a form of a lower electrode of the solid-state imaging device 1 according to a fourth embodiment.

Among the components illustrated in FIG. 11, the component corresponding to the above-described component is provided with a same reference sign. Overlapping description will be appropriately omitted. The configuration illustrated in FIG. 11 differs from the configuration illustrated in FIG. 6 mainly in that the areas in a plan view of the lower electrodes of the phase difference pixel 2P, formed in two divided portions, differ from each other.

As illustrated in FIG. 11, the lower electrode of the phase difference pixel 2PA includes the lower electrode 51A-1, the lower electrode 51A-2, and the lower electrode separating section 51A-3. The lengths of the lower electrode 51A-1 and the lower electrode 51A-2 in the vertical direction are the same, although the lengths in the horizontal direction differ from each other, that is, the lower electrode 51A-2 has a longer length in the horizontal direction. The area of the lower electrode 51A-2 is larger than the area of the lower electrode 51A-1. The lower electrode 51A-2 having a larger area is the lower electrode that is not used for phase difference detection.

The lower electrode separating section 51A-3 with a small width is formed at a position biased toward the left side from the vertical axis represented by line B-B', passing through the center of the phase difference pixel 2PA.

Similarly, the lower electrode of the phase difference pixel 2PB includes a lower electrode 51B-1, a lower electrode 51B-2, and a lower electrode separating section 51B-3. The lengths of the lower electrode 51B-1 and the lower electrode 51B-2 in the vertical direction are the same, although the lengths in the horizontal direction differ from each other, that is, the lower electrode 51B-1 has a longer length in the horizontal direction. The area in a plan view of the lower electrode 51B-1 is larger than the area in the plan view of the lower electrode 51B-2. The lower electrode 51B-1 having a larger area is the lower electrode that is not used for phase difference detection.

The lower electrode separating section 51B-3 with a small width is formed at a position biased toward the right side from the vertical axis passing through the center of the phase difference pixel 2PB.

When the lower electrode separating section 51A-3 is assumed to be included in a lower electrode region, the area in a plan view of the lower electrode formed on the phase difference pixel 2PA is larger than the area of the lower electrode 51C formed on the imaging pixel 2X. This is also applicable to the lower electrode formed on the phase difference pixel 2PB.

Figure 12:
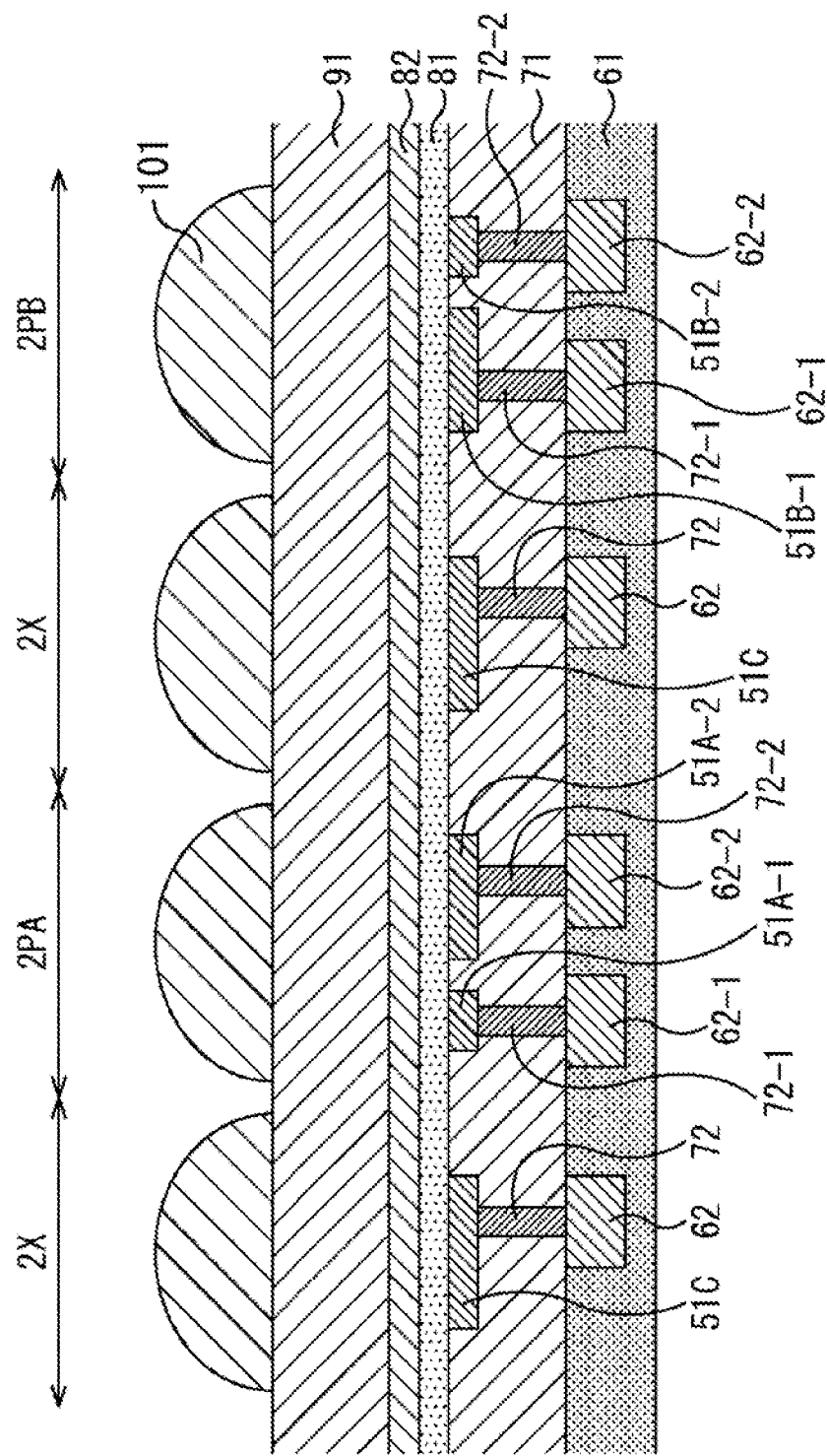
FIG. 12 is a cross-sectional view illustrating a structure of a pixel according to the fourth embodiment.

FIG. 12 is a cross-sectional view illustrating a pixel structure taken along line A-A' in FIG. 11.

Among the components illustrated in FIG. 12, the component corresponding to the above-described component is provided with a same reference sign. Overlapping description will be appropriately omitted. The configuration illustrated in FIG. 12 differs from the configuration illustrated in FIG. 10 in that the length, in the horizontal direction, of the lower electrodes of the phase difference pixel 2P, formed in two divided portions, differ from each other.

The lower electrode 51A-1 of the phase difference pixel 2PA is connected to a charge accumulation unit 62-1 via metal wiring 72-1. The lower electrode 51A-2 is connected to the charge accumulation unit 62-2 via the metal wiring 72-2.

Among the signal charges obtained by photoelectric conversion performed on the phase difference pixel 2PA, the signal charge collected by the lower electrode 51A-1 is accumulated onto the charge accumulation unit 62-1, and the signal charge collected by the lower electrode 51A-2 is accumulated onto the charge accumulation unit 62-2.

Specifically, the phase difference pixel 2PA outputs a signal corresponding to the signal charge accumulated in the charge accumulation unit 62-1, and outputs a signal corresponding to the signal charge accumulated in the charge accumulation unit 62-2. However, the latter signal, for example, is not used for phase difference detection.

Meanwhile, the lower electrode 51B-1 of the phase difference pixel 2PB is connected to the charge accumulation unit 62-1 via the metal wiring 72-1. The lower electrode 51B-2 is connected to the charge accumulation unit 62-2 via the metal wiring 72-2.

Among the signal charges obtained by photoelectric conversion performed on the phase difference pixel 2PB, the signal charge collected by the lower electrode 51B-1 is accumulated onto the charge accumulation unit 62-1, and the signal charge collected by the lower electrode 51B-2 is accumulated onto the charge accumulation unit 62-2.

Specifically, the phase difference pixel 2PB outputs a signal corresponding to the signal charge accumulated in the charge accumulation unit 62-1, and outputs a signal corresponding to the signal charge accumulated in the charge accumulation unit 62-2. However, the former signal, for example, is not used for phase difference detection.

Figure 13:
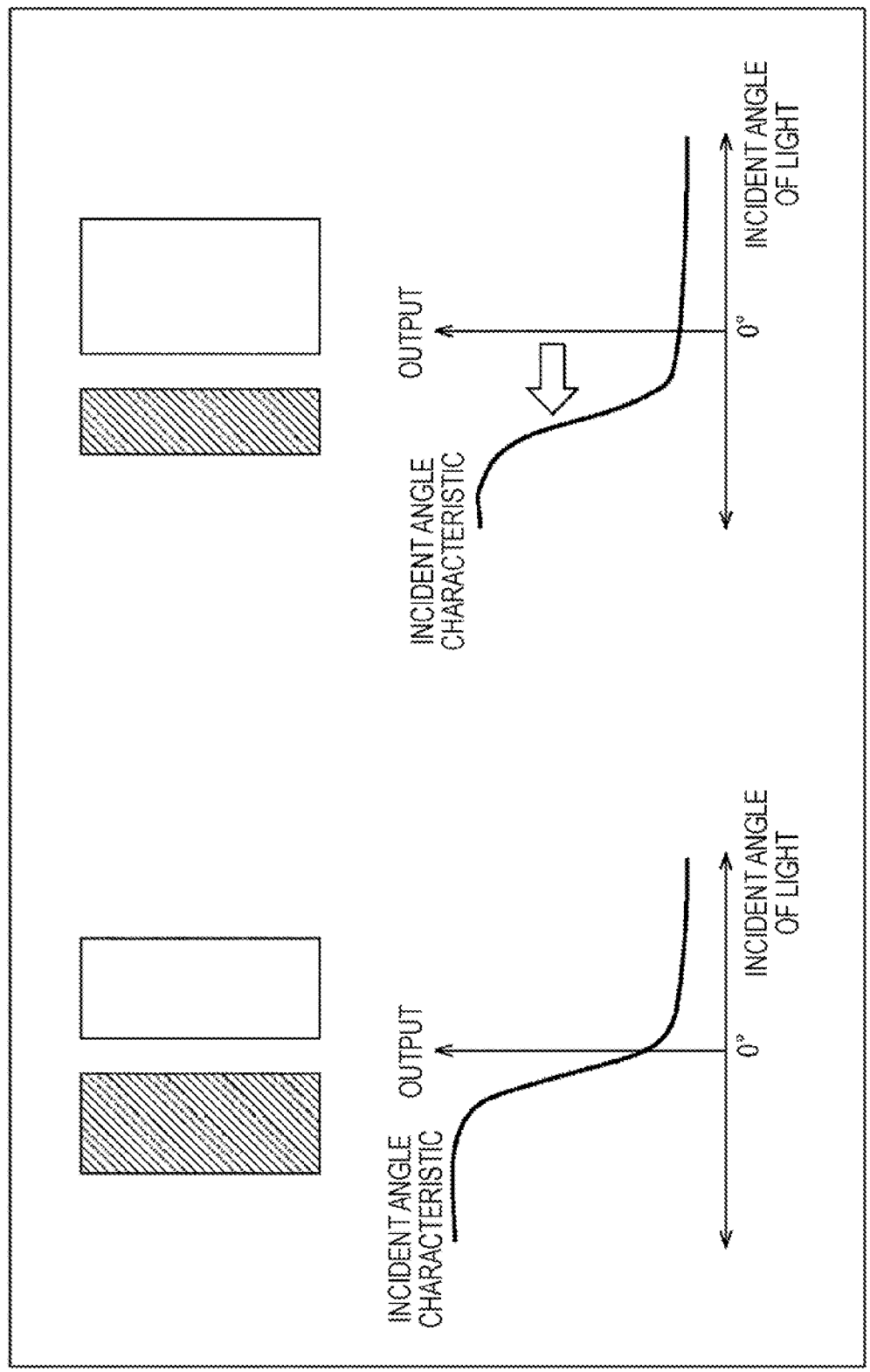
FIG. 13 is a diagram illustrating an output voltage characteristic with respect to an incident angle of light.

FIG. 13 is a diagram illustrating an exemplary output voltage characteristic with respect to an incident angle of light.

The graph on the left side in FIG. 13, as indicated on its upper portion, illustrates a characteristic in a case where the separating section of the lower electrode is formed to pass through the center of the phase difference pixel 2P. The phase difference pixel 2P, for which an output voltage characteristic is illustrated in FIG. 13, has sensitivity toward the light with an incident angle in the negative direction.

In contrast, the graph on the right side in FIG. 13, as indicated on its upper portion, illustrates a characteristic in a case where the separating section of the lower electrode is formed to pass through a position biased toward the left side with respect to the center of the phase difference pixel 2P. In this case, as indicated with an open arrow on the graph, the curved line indicating the output voltage shifts so as to have higher sensitivity toward the light with the incident angle in more negative direction. For example, an output voltage characteristic for the phase difference pixel 2PA in FIG. 11 is the characteristic illustrated in the graph illustrated on the right side in FIG. 13.

Figure 14:
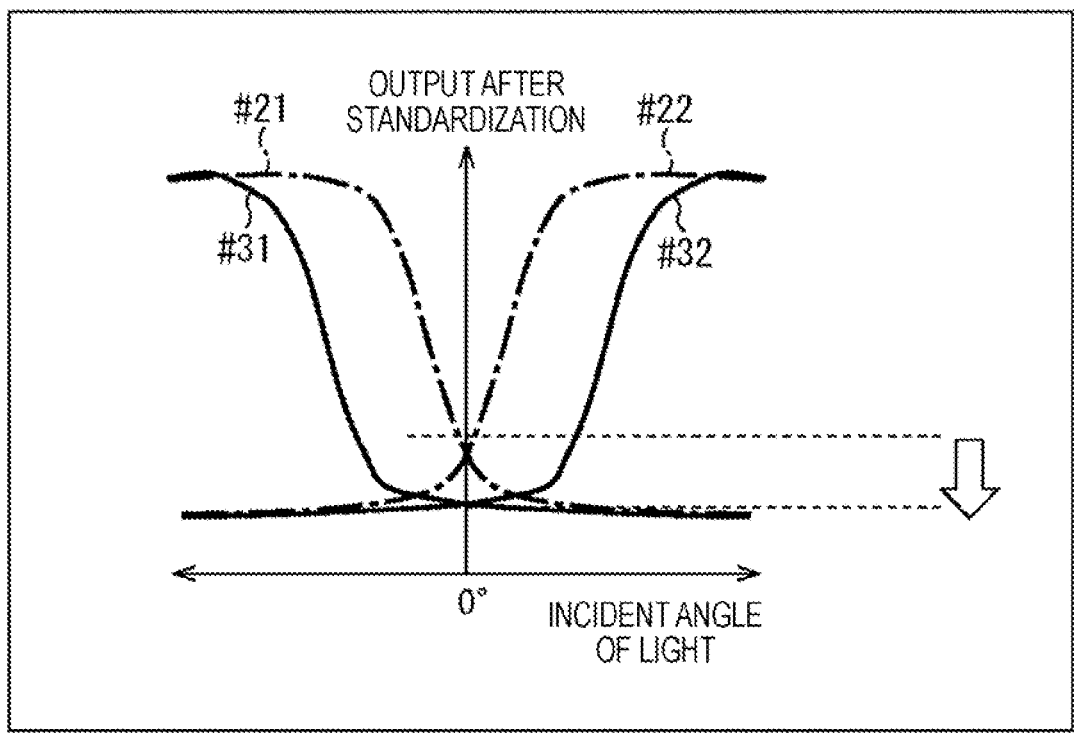
FIG. 14 is a diagram illustrating an output voltage characteristic with respect to an incident angle of light.

FIG. 14 is a diagram illustrating a characteristic of an output voltage after standardization, of each of the phase difference pixel 2PA and the phase difference pixel 2PB, illustrated in FIG. 11.

The curved lines #21 and #22 each illustrates a characteristic in a case where the separating section of the lower electrode is formed to pass through the center of the phase difference pixel 2P. The curved lines #31 and #32 each illustrates a characteristic in a case where the separating section of the lower electrode is formed to pass through a position biased with respect to the center of the phase difference pixel 2P. The curved line #31 indicates a characteristic of the phase difference pixel 2PA illustrated in FIG. 11, having sensitivity toward the light with an incident angle in the negative direction. The curved line #32 indicates a characteristic of the phase difference pixel 2PB illustrated in FIG. 11, having sensitivity toward the light having an incident angle in the positive direction.

By forming the lower electrode so as to allow the separating section to be biased and then shifting the output voltage characteristic, as illustrated by an open arrow, it is possible to lower the output voltage when the incident angle is 0°, and to ensure large sensitivity change when the incident angle is changed. As a result, it is possible to enhance phase difference detection accuracy when the incident angle is changed.

In this manner, when the configuration illustrated in FIGS. 11 and 12 according to the fourth embodiment is employed, it is possible to obtain the effects similar to the case where the configuration in FIG. 10 according to the third embodiment is employed. Moreover, it is possible to enhance phase difference detection accuracy when the incident angle is changed.

It is also possible to use a configuration without connecting the lower electrodes 51A-2 and 51B-1 being lower electrodes that are not used for phase difference detection, with the charge accumulation unit.

6. Exemplary Pixel Structure According to Fifth Embodiment

Figure 15:
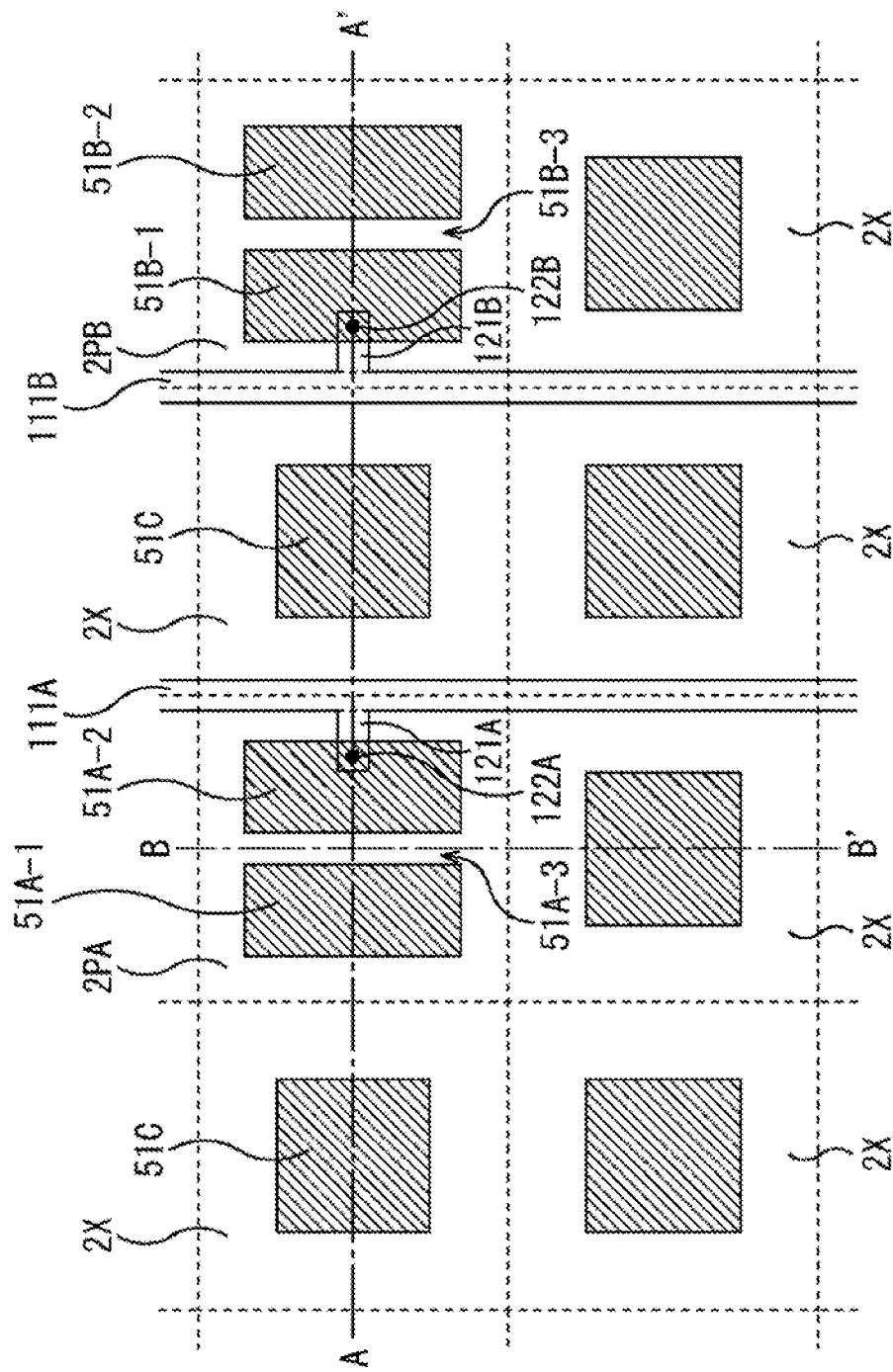
FIG. 15 is a plan view illustrating a form of a lower electrode according to a fifth embodiment.

FIG. 15 is a plan view illustrating a form of the lower electrode of the solid-state imaging device 1 according to a fifth embodiment.

Among the components illustrated in FIG. 15, the component corresponding to the above-described component is provided with a same reference sign. Overlapping description will be appropriately omitted. The configuration illustrated in FIG. 15 differs from the configuration illustrated in FIG. 6 mainly in that the lower electrode that is not used for phase difference detection is connected to the metal wiring as a signal charge discharge section. The metal wiring is connected to a fixed voltage within the solid-state imaging device 1, for example, to GND.

As illustrated in FIG. 15, metal wiring 111A with a small width is provided between the phase difference pixel 2PA and the imaging pixel 2X provided on the right side of the phase difference pixel 2PA. The lower electrode 51A-2 of the phase difference pixel 2PA is connected, via a contact hole 122A, to a connecting section 121A protruding as a portion of the metal wiring 111A in the left direction. The signal charge collected by the lower electrode 51A-2 is discharged onto the metal wiring 111A without being used for output of a phase difference signal.

In addition, metal wiring 111B with a small width is provided between the phase difference pixel 2PB and the imaging pixel 2X provided on the left side of the phase difference pixel 2PB. The lower electrode 51B-1 of the phase difference pixel 2PB is connected, via a contact hole 122B, to a connecting section 121B protruding as a portion of the metal wiring 111B in the right direction. The signal charge collected by the lower electrode 51B-1 is discharged onto the metal wiring 111B without being used for output of a phase difference signal.

Figure 16:
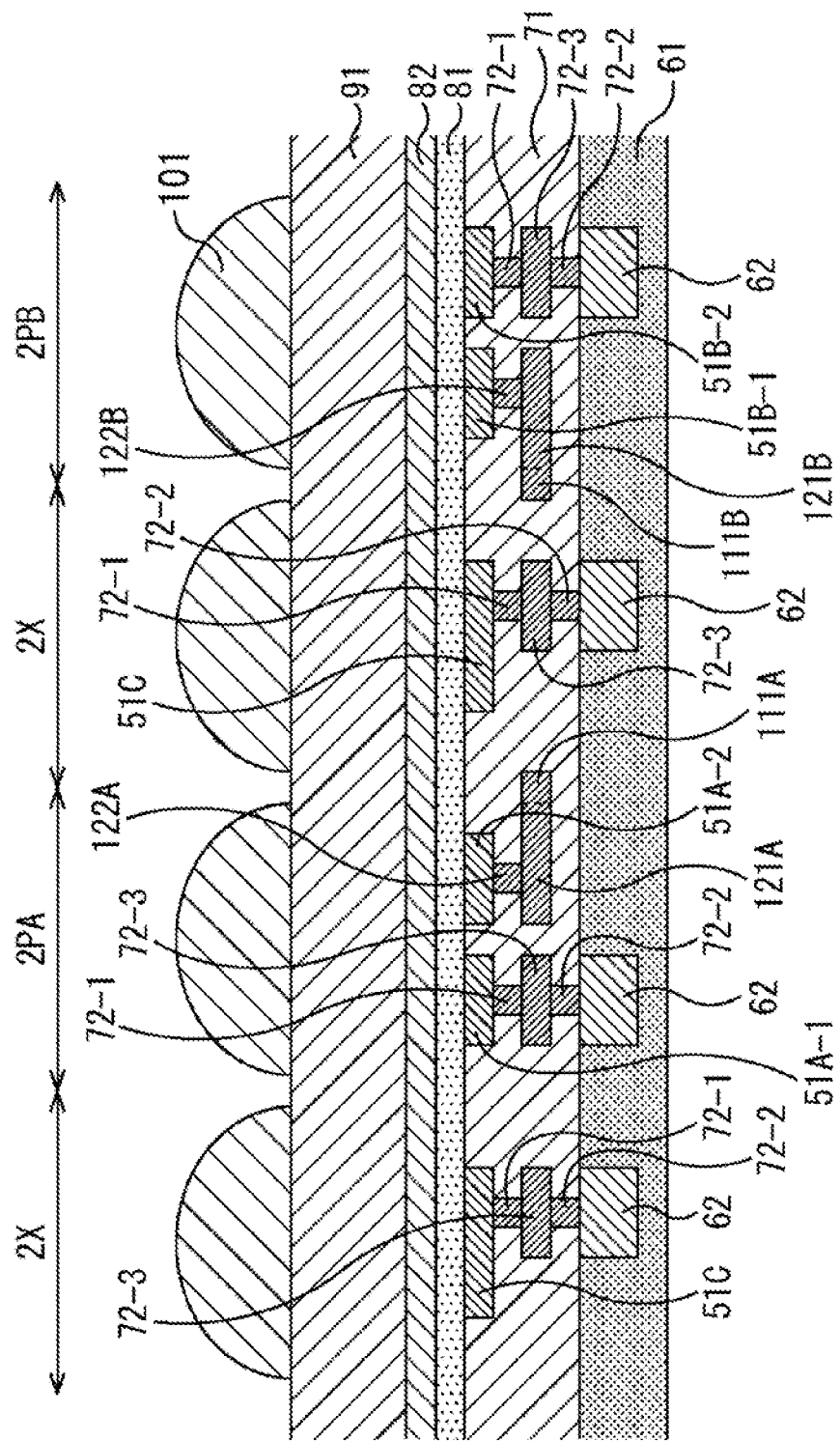
FIG. 16 is a cross-sectional view illustrating a structure of a pixel according to the fifth embodiment.

FIG. 16 is a cross-sectional view illustrating a pixel structure taken along line A-A' in FIG. 15.

Among the components illustrated in FIG. 16, the component corresponding to the above-described component is provided with a same reference sign. Overlapping description will be appropriately omitted.

The lower electrodes 51A-1 and 51A-2 are provided on the phase difference pixel 2PA. The lower electrode 51A-1is connected to the charge accumulation unit 62 via the metal wiring 72-1 to 72-3. In an example in FIG. 16, metal wiring configured to connect the lower electrode and the charge accumulation unit is formed with the metal wiring 72-1 to 72-3. The metal wiring 72-3 has a width greater than the metal wiring 72-1 positioned above the metal wiring 72-3, and greater than the metal wiring 72-2 positioned below the metal wiring 72-3. In an example in FIG. 16, the lower electrode 51C and the charge accumulation unit 62, of the imaging pixel 2X, are connected with each other in a similar manner.

The lower electrode 51A-2 of the phase difference pixel 2PA is connected, via the contact hole 122A, to the connecting section 121A integrally formed with the metal wiring 111A. The metal wiring 111A is formed on a layer below the layer of the lower electrode 51A-2.

Among the signal charges obtained by photoelectric conversion performed on the phase difference pixel 2PA, the signal charge collected by the lower electrode 51A-1 is accumulated onto the charge accumulation unit 62, and the signal charge collected by the lower electrode 51A-2 is discharged onto the metal wiring 111A.

The lower electrodes 51B-1 and 51B-2 are provided on the phase difference pixel 2PB. The lower electrode 51B-1 is connected, via the contact hole 122B, to the connecting section 121B integrally formed with the metal wiring 111B. The metal wiring 111B is formed on a layer below the layer of the lower electrode 51B-1. The lower electrode 51B-2 is connected to the charge accumulation unit 62 via the metal wiring 72-1 to 72-3.

Among the signal charges obtained by photoelectric conversion performed on the phase difference pixel 2PB, the signal charge collected by the lower electrode 51B-2 is accumulated onto the charge accumulation unit 62, and the signal charge collected by the lower electrode 51B-1 is discharged onto the metal wiring 111B.

In this manner, when the configuration illustrated in FIGS. 15 and 16 according to the fifth embodiment is employed, it is possible to obtain the effects similar to the case where the configuration in FIG. 10 according to the third embodiment is employed. Furthermore, it is not necessary to provide two charge accumulation units for the phase difference pixel 2P within the semiconductor substrate 61, and thus, it is possible to enhance flexibility of layout when elements are arranged within the semiconductor substrate 61.

Alternatively, it is also allowable to form the lower electrode of the phase difference pixel 2P, as described with reference to FIG. 11, to be separated at a position biased with respect to a vertical axis as a reference passing through the center of the phase difference pixel 2P. It is also possible to provide the metal wiring as a signal charge discharging section between the phase difference pixel 2P and its adjacent imaging pixel 2X, in the horizontal direction.

7. Exemplary Pixel Structure According to Sixth Embodiment

Figure 17:
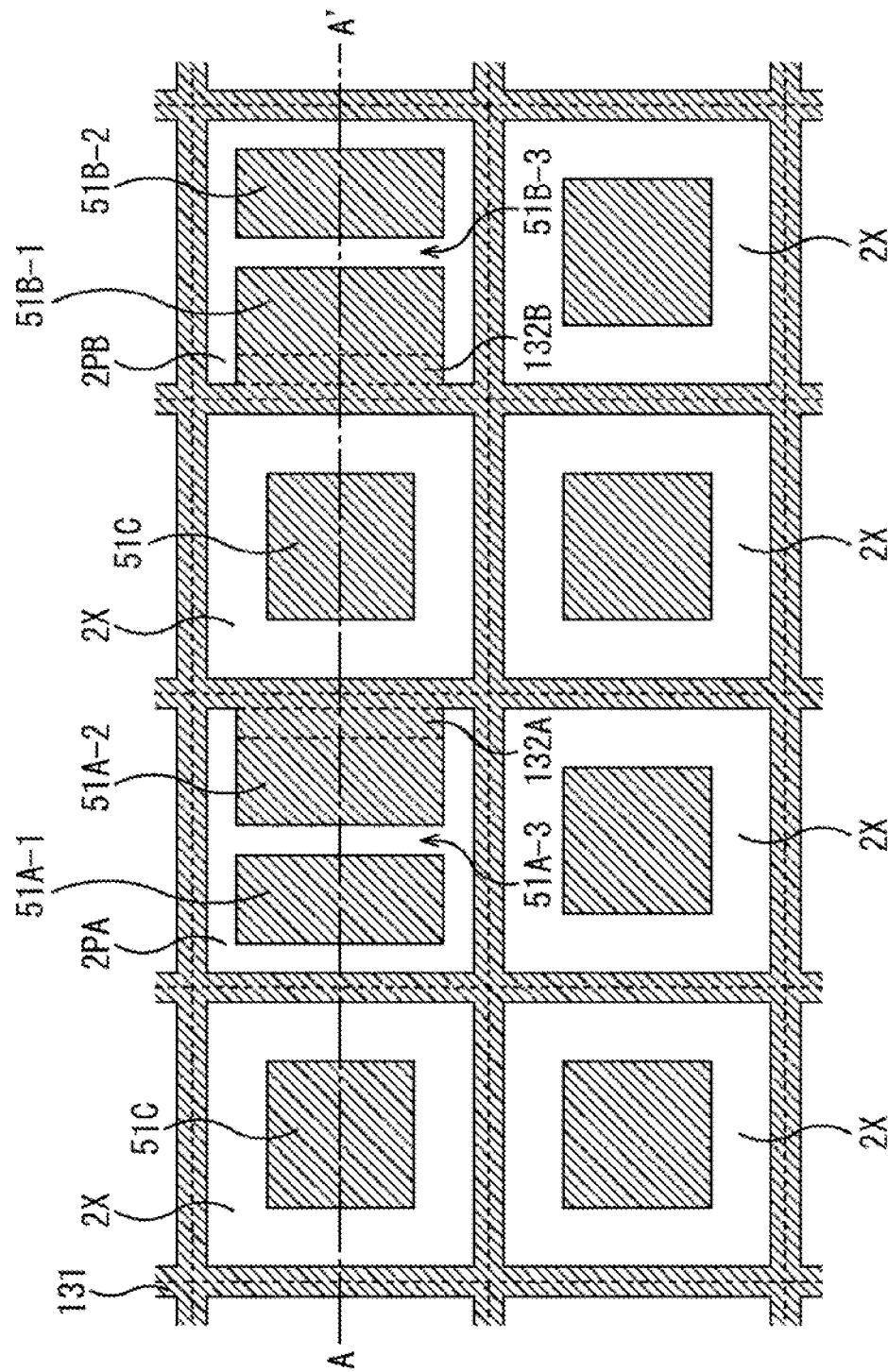
FIG. 17 is a plan view illustrating a form of a lower electrode according to a sixth embodiment.

FIG. 17 is a plan view illustrating a form of a lower electrode of the solid-state imaging device 1 according to a sixth embodiment.

Among the components illustrated in FIG. 17, the component corresponding to the above-described component is provided with a same reference sign. Overlapping description will be appropriately omitted. The configuration illustrated in FIG. 17 differs from the configuration illustrated in FIG. 6 mainly in that the lower electrode that is not used for phase difference detection is connected to an inter-pixel electrode formed of a material that is the same as the material of the lower electrode.

As illustrated in FIG. 17, an inter-pixel electrode 131 with a small width is formed so as to enclose the pixel 2. Within the solid-state imaging device 1, the inter-pixel electrode 131 is connected to a fixed voltage, for example GND.

The lower electrode 51A-2 of the phase difference pixel 2PA is connected to a portion of the inter-pixel electrode 131, formed on a boundary between the phase difference pixel 2PA and the adjacent imaging pixel 2X on the right of the phase difference pixel 2PA, via a lower electrode extending portion 132A. The lower electrode 51A-2 is integrally formed with the inter-pixel electrode 131 and the lower electrode extending portion 132A. The length of the lower electrode extending portion 132A in the vertical direction is equal to the length of the lower electrode 51A-2 in the vertical direction. The signal charge collected by the lower electrode 51A-2 is discharged onto the inter-pixel electrode 131 without being used for output of a phase difference signal.

The lower electrode 51B-1 of the phase difference pixel 2PB is connected, via a lower electrode extending portion 132B, to a portion of the inter-pixel electrode 131 formed on a boundary between the phase difference pixel 2PB and the adjacent imaging pixel 2X on the left side of the phase difference pixel 2PB. The lower electrode 51B-1 is integrally formed with the inter-pixel electrode 131 and the lower electrode extending portion 132B. The length of the lower electrode extending portion 132B in the vertical direction is equal to the length of the lower electrode 51B-1 in the vertical direction. The signal charge collected by the lower electrode 51B-1 is discharged onto the inter-pixel electrode 131 without being used for output of a phase difference signal.

When the lower electrode separating section 51A-3 is assumed to be included in a lower electrode region, the area in a plan view of the lower electrode formed on the phase difference pixel 2PA is larger than the area in the plan view of the lower electrode 51C formed on the imaging pixel 2X. This is also applicable to the lower electrode formed on the phase difference pixel 2PB.

Figure 18:
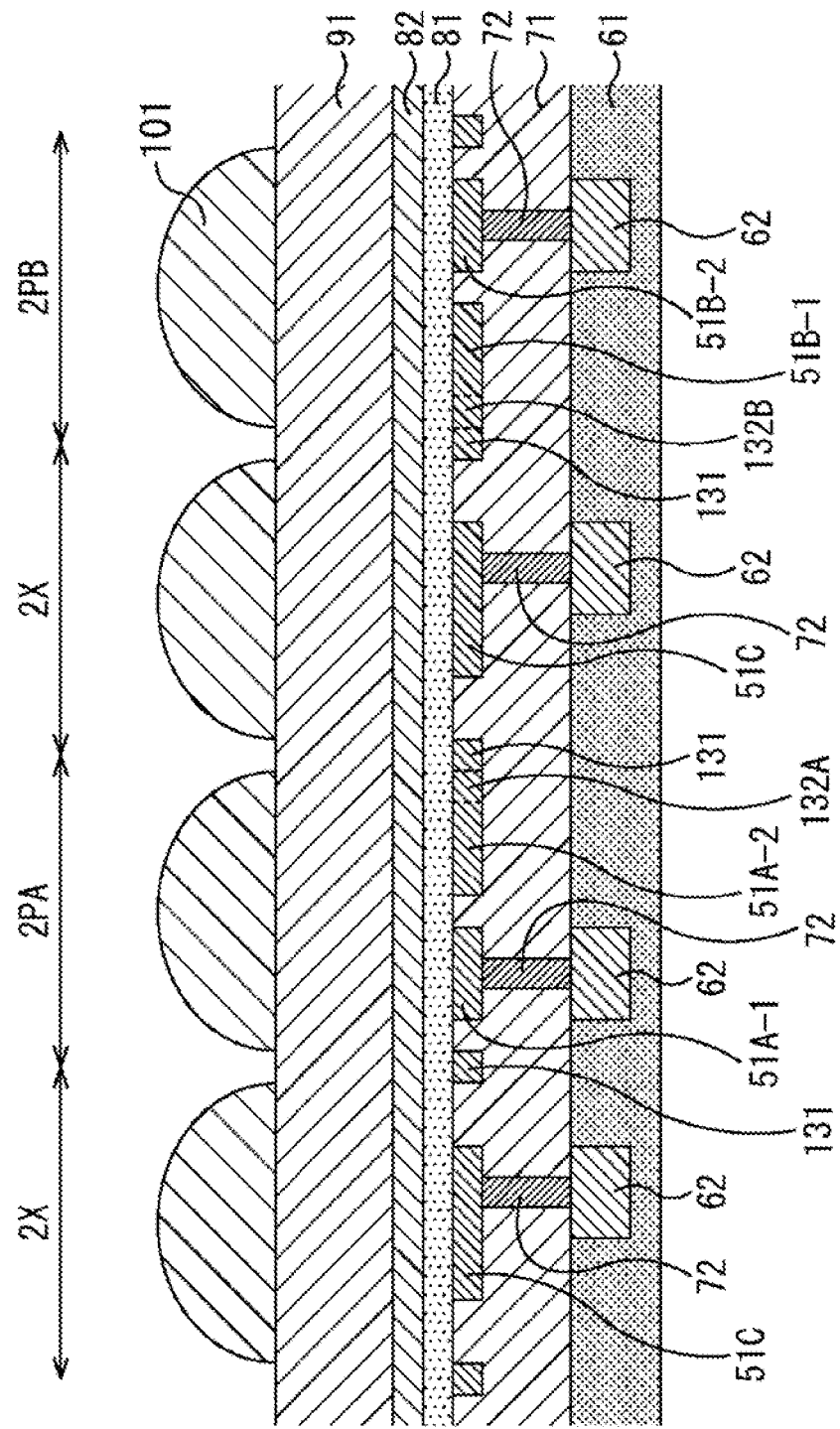
FIG. 18 is a cross-sectional view illustrating a structure of a pixel according to the sixth embodiment.

FIG. 18 is a cross-sectional view illustrating a pixel structure taken along line A-A' in FIG. 17.

Among the components illustrated in FIG. 18, the components corresponding to the components illustrated in FIG. 10 are provided with same reference signs. Overlapping description will be appropriately omitted.

The lower electrodes 51A-1 and 51A-2 are provided on the phase difference pixel 2PA. The lower electrode 51A-2 is connected, via a lower electrode extending portion 132A, to a portion of the inter-pixel electrode 131, formed on a boundary between oneself and the adjacent imaging pixel 2X on the right. The inter-pixel electrode 131 and the lower electrode extending portion 132A are integrally formed on a same layer, using the material same as the material of the lower electrode 51A-2.

Among the signal charges obtained by photoelectric conversion performed on the phase difference pixel 2PA, the signal charge collected by the lower electrode 51A-1 is accumulated onto the charge accumulation unit 62, and the signal charge collected by the lower electrode 51A-2 is discharged onto the inter-pixel electrode 131.

The lower electrodes 51B-1 and 51B-2 are provided on the phase difference pixel 2PB. The lower electrode 51B-1is connected, via a lower electrode extending portion 132B, to a portion of the inter-pixel electrode 131, formed on a boundary between oneself and the adjacent imaging pixel 2X on the left. The inter-pixel electrode 131 and the lower electrode extending portion 132B are integrally formed on a same layer, using the material same as the material of the lower electrode 51B-1.

Among the signal charges obtained by photoelectric conversion performed on the phase difference pixel 2PB, the signal charge collected by the lower electrode 51B-2 is accumulated onto the charge accumulation unit 62, and the signal charge collected by the lower electrode 51B-1 is discharged onto the inter-pixel electrode 131.

In this manner, when the configuration illustrated in FIGS. 17 and 18 according to the sixth embodiment is employed, it is possible to obtain the effects similar to the case where the configuration in FIGS. 15 and 16 according to the fifth embodiment is employed. In addition, since there is no need to form metal wiring between the pixels 2, it is not necessary to provide steps to form the metal wiring.

Note that the inter-pixel electrode 131 is also used for discharging the signal charge generated between the pixels.

Since the photoelectric conversion film 81 is formed across the pixels 2, a signal charge is generated even between the pixels.

Alternatively, it is also allowable to form the lower electrode of the phase difference pixel 2P, as described with reference to FIG. 11, to be separated at a position biased with respect to a vertical axis passing through the center of the phase difference pixel 2P.

8. Exemplary Pixel Structure According to Seventh Embodiment

Figure 19:
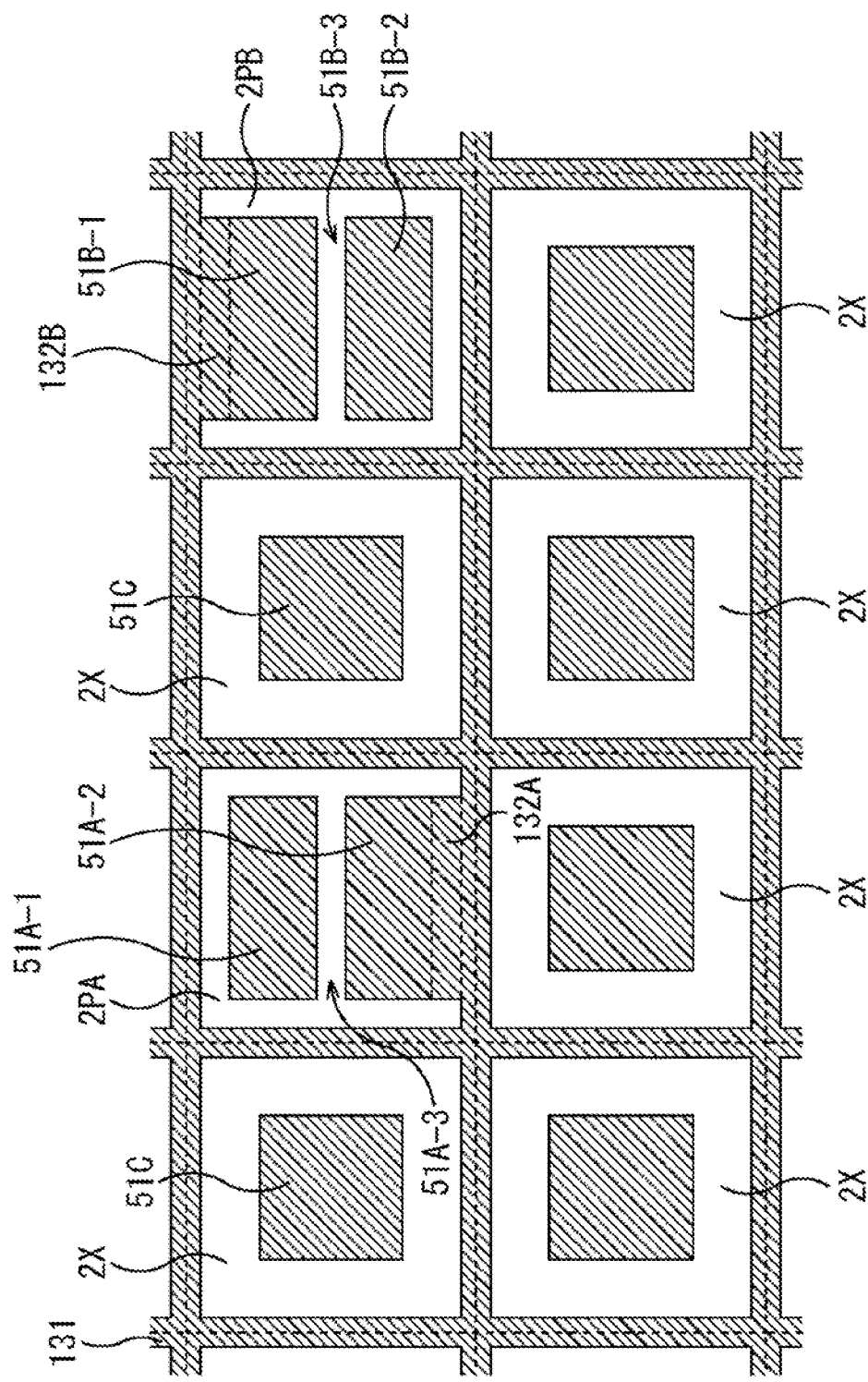
FIG. 19 is a plan view illustrating a form of a lower electrode according to a seventh embodiment.

FIG. 19 is a plan view illustrating a form of a lower electrode of the solid-state imaging device 1 according to a seventh embodiment.

Among the components illustrated in FIG. 19, the components corresponding to the components illustrated in FIG. 17 are provided with same reference signs. Overlapping description will be appropriately omitted. The configuration illustrated in FIG. 19 differs from the configuration illustrated in FIG. 17 mainly in that the direction of dividing and arranging the lower electrode of the phase difference pixel 2P is the vertical direction.

A substantially horizontally-long rectangular lower electrode 51A-1 is provided on the phase difference pixel 2PA. On the cross-sectional view of the phase difference pixel 2PA, the lower electrode 51A-1 is connected to the charge accumulation unit 62 via the metal wiring 72.

On the phase difference pixel 2PA, the lower electrode 51A-2 is formed below the lower electrode 51A-1, separated from the lower electrode 51A-1. The lower electrode 51A-2 is connected to a portion of the inter-pixel electrode 131, formed on a boundary between the phase difference pixel 2PA and the adjacent imaging pixel 2X below the phase difference pixel 2PA, via the lower electrode extending portion 132A.

The lower electrode 51A-2, the inter-pixel electrode 131, and the lower electrode extending portion 132A are integrally formed with each other. The length of the lower electrode extending portion 132A in the horizontal direction is equal to the length of the lower electrode 51A-2 in the horizontal direction. The signal charge collected by the lower electrode 51A-2 is discharged onto the inter-pixel electrode 131 without being used for output of a phase difference signal.

A substantially horizontally-long rectangular lower electrode 51B-2 is provided on the phase difference pixel 2PB. On the cross-sectional view of the phase difference pixel 2PB, the lower electrode 51B-2 is connected to the charge accumulation unit 62 via the metal wiring 72.

On the phase difference pixel 2PB, the lower electrode 51B-1 is formed above the lower electrode 51B-2, separated from the lower electrode 51B-2. The lower electrode 51B-1 is connected to a portion of the inter-pixel electrode 131, formed on a boundary between the phase difference pixel 2PB and the adjacent imaging pixel 2X above the phase difference pixel 2PB, via the lower electrode extending portion 132B.

The lower electrode 51B-1, the inter-pixel electrode 131, and the lower electrode extending portion 132B are integrally formed with each other. The length of the lower electrode extending portion 132B in the horizontal direction is equal to the length of the lower electrode 51B-1 in the horizontal direction. The signal charge collected by the lower electrode 51B-1 is discharged onto the inter-pixel electrode 131 without being used for output of a phase difference signal.

In this manner, when the configuration illustrated in FIG. 19 according to the seventh embodiment is employed, it is possible to obtain the effects similar to the case where the configuration in FIGS. 17 and 18 according to the sixth embodiment is employed. Moreover, since the lower electrodes of the phase difference pixel 2P are arranged to be separated into up-down directions, it is possible to accurately detect a phase difference in a case where the optical axis of the incident light changes in the up-down direction.

9. Modification

As described with reference to FIG. 19, dividing and arranging the lower electrode of the phase difference pixel 2P in the up-down directions can be applied to the configuration of the lower electrode of the phase difference pixel 2P in the second to fifth embodiments. Alternatively, it is also allowable to divide and arrange the lower electrode of the phase difference pixel 2P in the diagonal direction (oblique direction).

Furthermore, it is also allowable to arrange within the pixel array unit 3, by mixing the phase difference pixel 2P having a lower electrode divided and arranged in the horizontal direction, the phase difference pixel 2P having a lower electrode divided and arranged in the vertical direction, and a phase difference pixel having a lower electrode divided and arranged in the diagonal direction.

In this manner, arrangement positions and forms of the lower electrodes within the phase difference pixel 2P are not limited. It would be sufficient that, within the phase difference pixel 2P, the lower electrode regions are asymmetrical with respect to the optical axis of the incident light and that the lower electrodes of the pair of phase difference pixels 2PA are arranged at symmetrical positions with each other.

Additionally, in the above description, the lower electrodes are separately provided for each of the pixels and the upper electrode is formed across all the pixels. Alternatively, it is also possible to reverse this configuration such that the upper electrodes are separately provided for each of the pixels and the lower electrode is formed across all the pixels. In this case, the upper electrodes are arranged in the above-described manner.

For example, in a case where the upper electrode of the phase difference pixel 2P is arranged in a manner illustrated in FIG. 6, any of the divided upper electrodes is connected to the charge accumulation unit 62. The signal charge obtained by performing photoelectric conversion is collected onto the upper electrode that is used for phase difference detection, transferred to and accumulated in the charge accumulation unit 62.

In this manner, it is also possible to use the upper electrode as the electrode that is arranged on the output side of the signal charge and that is divided for each of the pixels. By separating and forming the upper electrode for each of the pixels and forming the lower electrode across all the pixels, it is also possible to achieve the above-described effects.

Exemplary Application to Electronic Apparatus

The above-described solid-state imaging device 1 can be applied, for example, to various electronic apparatuses including imaging devices such as a digital still camera and a digital video camera, a mobile phone having an imaging function, or an audio player having an imaging function.

Figure 20:
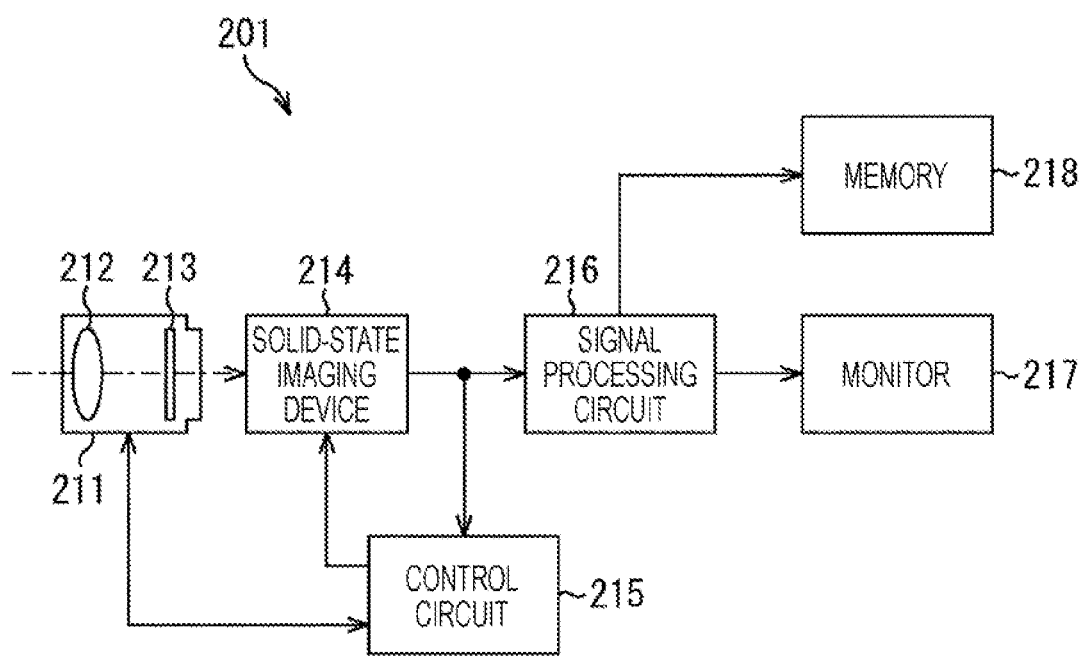
FIG. 20 is a block diagram illustrating an exemplary configuration of an imaging device.

FIG. 20 is a block diagram illustrating an exemplary configuration of a solid-state imaging device.

An imaging device 201 includes an optical unit 211, a solid-state imaging device 214, a control circuit 215, a signal processing circuit 216, a monitor 217, and a memory 218. The imaging device 201 is an electronic apparatus capable of imaging a still image and a moving image.

The optical unit 211 includes one or more image-forming lenses 212 and an aperture stop 213, guides light (incident light) from an object to the solid-state imaging device 214, and forms an image on a light-receiving plane of the solid-state imaging device 214.

The solid-state imaging device 214 includes the above-described solid-state imaging device 1. The solid-state imaging device 214 accumulates a signal charge for a fixed period of time according to the light that forms an image on the light-receiving plane through the image-forming lens 212 and the aperture stop 213. The signal charge accumulated in the solid-state imaging device 214 is transferred according to a drive signal (timing signal) supplied from the control circuit 215. The solid-state imaging device 214 may be formed as a one-chip device or a portion of a camera module packaged with the optical unit 211, the signal processing circuit 216, or the like.

The control circuit 215 outputs a drive signal that controls transfer operation and shutter operation of the solid-state imaging device 214 and drives the solid-state imaging device 214. The control circuit 215 also adjusts the image-forming lens 212 and the aperture stop 213 of the optical unit 211 on the basis of a pixel signal (phase difference signal or imaging signal) obtained from the solid-state imaging device 214.

The signal processing circuit 216 performs various signal processing functions on the pixel signal output from the solid-state imaging device 214. The image (image data) obtained by the signal processing performed by the signal processing circuit 216 is supplied to and displayed on the monitor 217, or supplied to and stored (recorded) in the memory 218.

As described above, by employing the solid-state imaging device 1 according to the above-described embodiments, as the solid-state imaging device 214, it is possible to detect a phase difference with high sensitivity. As a result, it is possible to enhance autofocus accuracy. Accordingly, it is also possible to enhance image quality of the captured image on a video camera, a digital still camera, and on the imaging device 201 including a camera module for mobile devices such as a mobile phone.

Exemplary Substrate Configuration of Solid-State Imaging Device

Figure 21A:
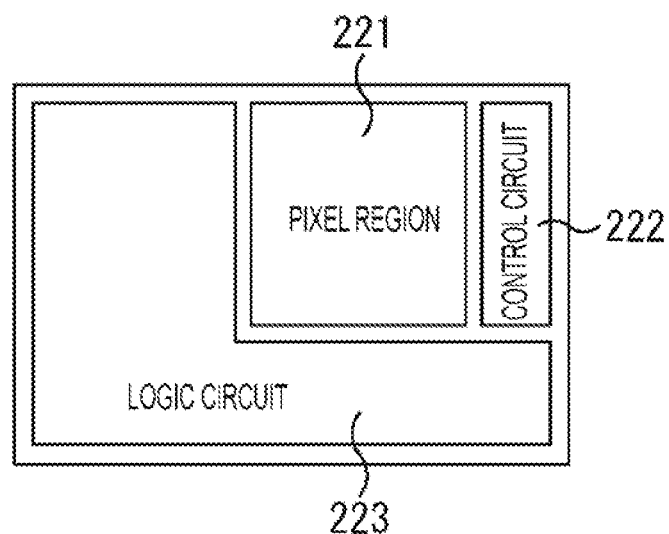
FIGS. 21A to 21C are exemplary substrate configurations of a solid-state imaging device.

The solid-state imaging device 1 includes a semiconductor substrate including, as illustrated in FIG. 21A, a pixel region 221 on which the plurality of pixels 2 are arranged, a control circuit 222 that controls the pixel 2, and a logic circuit 223 that includes a signal processing circuit for pixel signals.

Figure 21B:
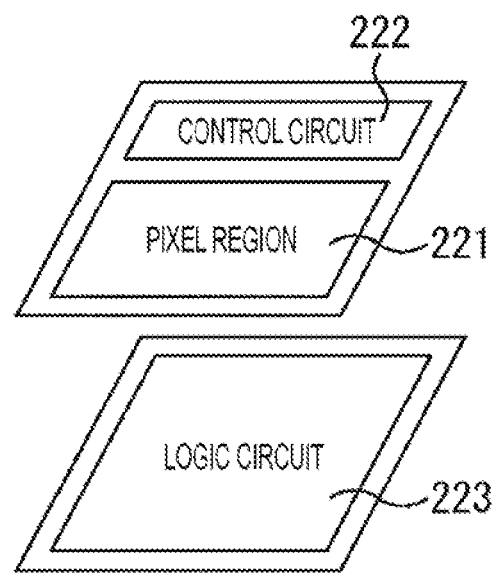

Alternatively, the solid-state imaging device 1 may be configured to include a stack structure that stacks, as illustrated in FIG. 21B, a first semiconductor substrate including the pixel region 221 and the control circuit 222, and a second semiconductor substrate including the logic circuit 223. The first semiconductor substrate is electrically connected with the second semiconductor substrate via, for example, a penetration via and Cu—Cu metallic bond.

Figure 21C:
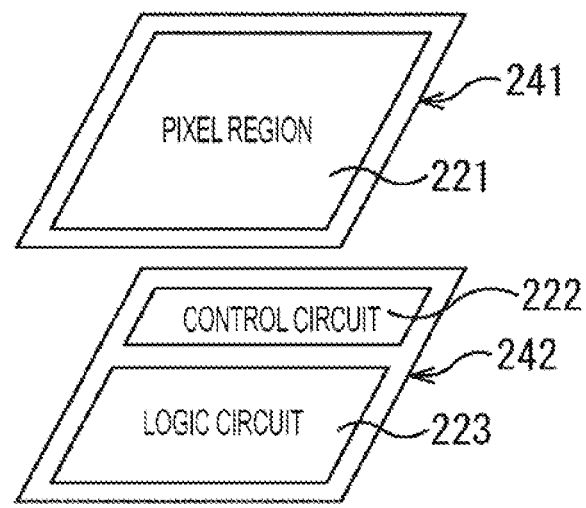

Alternatively, the solid-state imaging device 1 may be configured to have a stack structure that stacks, as illustrated in FIG. 21C, a first semiconductor substrate including uniquely the pixel region 221, and a second semiconductor substrate including the control circuit 222 and the logic circuit 223. The first semiconductor substrate is electrically connected with the second semiconductor substrate via, for example, a penetration via and Cu—Cu metallic bond.

Exemplary Application of Solid-State Imaging Device 1

Figure 22:
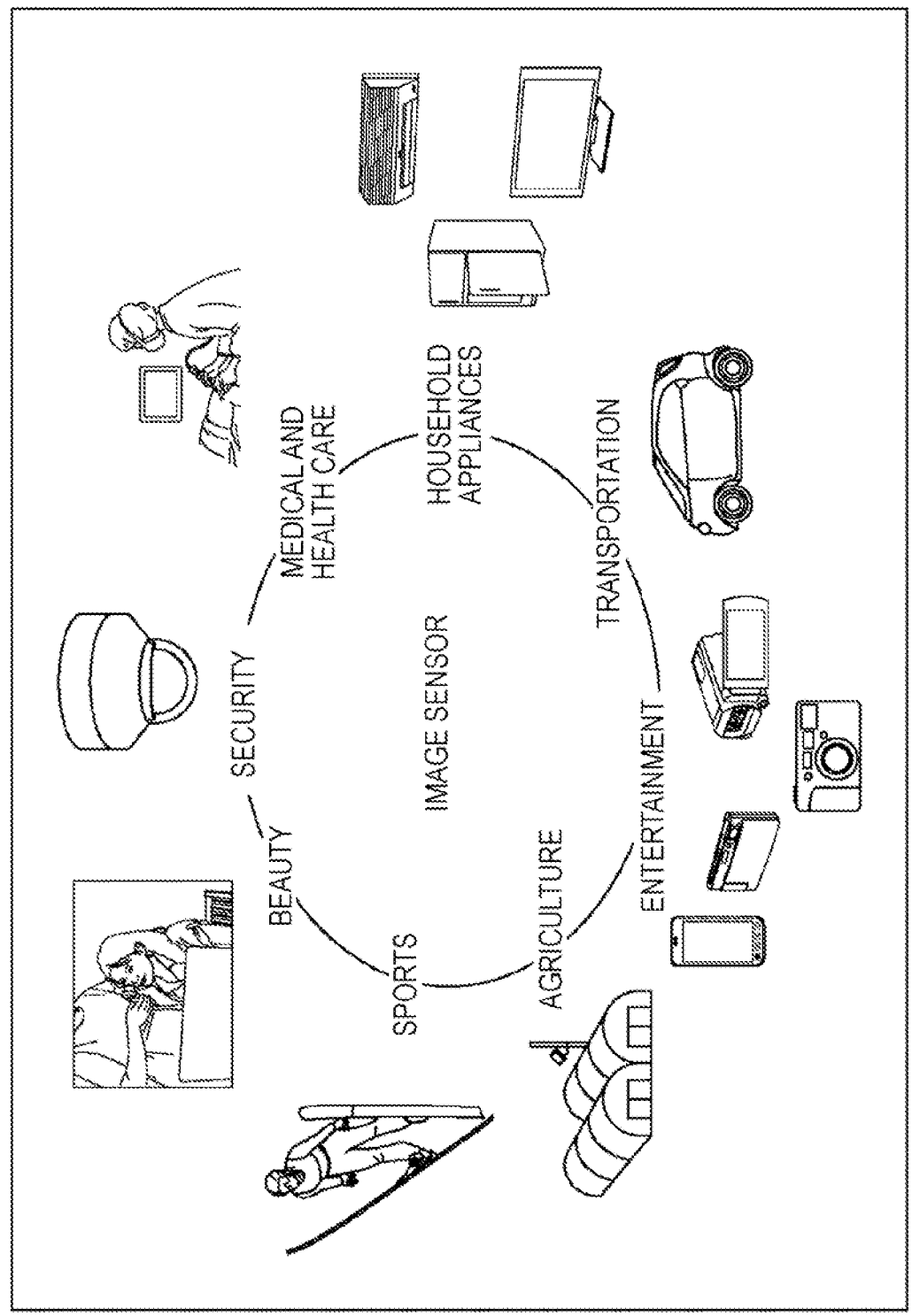
FIG. 22 illustrates exemplary applications of a solid-state imaging device.

FIG. 22 is a diagram illustrating exemplary applications of the solid-state imaging device 1.

The solid-state imaging device 1 is applicable to various situations in which sensing is performed for light including visual light, infrared light, ultraviolet light, and X-ray. Examples of such situations are described as follows.

- A device for capturing an image for entertainment, such as a digital camera and a mobile phone with a camera function.
- A device for transportation, such as an on-vehicle sensor that images a front, back, surroundings, interior, or the like, of a vehicle in order to ensure safe driving including automatic stop, and to recognize driver's conditions, a monitor camera to monitor driving vehicles and roads, and a range-finding sensor to perform measurement of a distance between vehicles, or the like.
- A device for household appliances including a TV, a refrigerator, and an air conditioner, to image user's gesture and perform operation of the apparatus according to the gesture.
- A device for medical and health care fields, such as an endoscope, and a device for angiography using reception of infrared light.
- A device for security, such as a monitor camera for crime prevention, and a camera for personal authentication.
- A device for beauty, such as a skin measuring instrument to image the skin, and a microscope to image the scalp.
- A device for sports, such as an action camera and a wearable camera for sports.
- A device for agriculture, such as a camera to monitor states of fields and farm products.

Embodiments of the present technology are not limited to the above-described embodiments but can be modified in a variety of ways within a scope of the present technology. For example, it is possible to employ all of the above-described plurality of embodiments, or an embodiment combining a part of the embodiments.

Exemplary Combination of Configurations

The present disclosure can be configured as follows.

(1)

A solid-state imaging device including:

an imaging pixel that includes an upper electrode and a lower electrode that sandwich a photoelectric conversion film and that is used for obtaining an imaging signal; and a phase difference pixel that includes the upper electrode and the lower electrode and that is used for obtaining a phase difference detection signal, wherein an area of one of the electrodes that is on an output side of a signal charge and that is divided and provided for each of pixels among the upper electrode and the lower electrode provided on the phase difference pixel is larger than an area of the one of the electrodes among the upper electrode and the lower electrode provided on the imaging pixel.

(2)

The solid-state imaging device according to (1), further including a light shielding film to limit incident light on top of the photoelectric conversion film of the phase difference pixel.

(3)

The solid-state imaging device according to (1), wherein the one of the electrodes of the phase difference pixel includes a first electrode, a second electrode, and a separating section that separates the first electrode from the second electrode.

(4)

The solid-state imaging device according to (3), wherein the separating section passes through the center of the phase difference pixel.

(5)

The solid-state imaging device according to (3) or (4), wherein, on the phase difference pixel, the area of the first electrode and the area of the second electrode are equal to each other.

(6)

The solid-state imaging device according to (3), wherein the separating section is formed at a position biased from the center of the phase difference pixel.

(7)

The solid-state imaging device according to (6), wherein, on the phase difference pixel, the area of the first electrode is smaller than the area of the second electrode.

(8)

The solid-state imaging device according to any of (3) to (7), wherein, the first electrode of the phase difference pixel is connected to a charge accumulation unit that is formed on a semiconductor substrate and is configured to accumulate a signal charge and output a phase difference signal to an outside.

(9)

The solid-state imaging device according to any of (3) to (8), wherein the second electrode on the phase difference pixel is connected to a charge discharge unit.

(10)

The solid-state imaging device according to (9), wherein the charge discharge unit includes metal wiring formed between the phase difference pixel and an adjacent pixel.

(11)

The solid-state imaging device according to (9), wherein the charge discharge unit is configured integrally with the second electrode by using a material same as the material of the first electrode and the second electrode, between the phase difference pixel and the adjacent pixel.

(12)

An electronic apparatus including a solid-state imaging device including:
  an imaging pixel that includes an upper electrode and a lower electrode that sandwich a photoelectric conversion film and that is used for obtaining an imaging signal; and
  a phase difference pixel that includes the upper electrode and the lower electrode and that is used for obtaining a phase difference detection signal,
  wherein an area of one of the electrodes that is on an output side of a signal charge and that is divided and provided for each of pixels among the upper electrode and the lower electrode provided on the phase difference pixel is larger than an area of the one of the electrodes among the upper electrode and the lower electrode provided on the imaging pixel.

(13)

An imaging device, comprising:
  a first pixel of a first pixel type, wherein the first pixel type is for phase difference detection, the first pixel including: a first electrode;
  a first portion of a photoelectric conversion film; and
  a first portion of a second electrode, wherein the first portion of the photoelectric conversion film is between the first electrode and the first portion of the second electrode, and wherein the first electrode of the first pixel has a first area; and
  a second pixel of a second pixel type, wherein the second pixel type is for imaging, the second pixel including:
  a first electrode;
  a second portion of the photoelectric conversion film; and
  a second portion of the second electrode, wherein the second portion of the photoelectric conversion film is between the first electrode and the second portion of the second electrode, wherein the first electrode of the second pixel has a second area, and wherein the first area is larger than the second area in a plan view.

(14)

The imaging device of (13), further comprising:
  a light shielding film, wherein the light shielding film is adjacent at least a portion of the first electrode of the first pixel.

(15)

The imaging device of (14), further comprising:
  an interlayer insulating film, wherein at least a portion of the interlayer insulating film is between the light shielding film and the first electrode of the first pixel.

(16)

The imaging device of any of (13) to (15), further comprising: a first charge accumulation unit, wherein the first electrode of the first pixel is connected to the first charge accumulation unit;
  a second charge accumulation unit, wherein the first electrode of the second pixel is connected to the second charge accumulation unit.

(17)

The imaging device of any of (13) to (16), wherein the first electrode of the first pixel and the first electrode of the second pixel are lower electrodes, and wherein the first portion of the second electrode of the first pixel and the second portion of the second electrode of the second pixel are upper electrodes.

(18)

The imaging device of (13), wherein the first electrode of the first pixel is divided into a first portion and a second portion, wherein the first portion of the first electrode is separated from the second portion of the first electrode.

(19)

The imaging device of (18), wherein the first portion of the first electrode is separated from the second portion of the second electrode by a separating section, and wherein the first area of the first electrode of the first pixel includes the first portion of the first electrode, the second portion of the first electrode, and the separating section.

(20)

The imaging device of (18) or (19), wherein the first portion of the first electrode is separated from the second portion of the second electrode by a separating section, and wherein the first area of the first electrode of the first pixel includes the first portion of the first electrode, the second portion of the first electrode, and the separating section.

(21)

(22)

The imaging device of any of (18) to (21), wherein an area of the first portion of the first electrode of the first pixel is different than an area of the second portion of the first electrode of the first pixel.

(22)

The imaging device of any of (18) to (21), further comprising: a first charge accumulation unit, wherein the first portion of the first electrode of the first pixel is connected to the first charge accumulation unit.

(23)

The imaging device of any of (18) to (22), wherein the second portion of the first electrode of the first pixel is connected to ground.

(24)

The imaging device of any of (18) to (23), wherein an area of the first portion of the first electrode of the first pixel is smaller than an area of the second portion of the first electrode of the first pixel.

(25)

The imaging device of any of (18) to (21) or (24), further comprising:
  a first charge accumulation unit, wherein the first portion of the first electrode of the first pixel is connected to the first charge accumulation unit;
  a second charge accumulation unit, wherein the second portion of the first electrode of the first pixel is connected to the second charge accumulation unit;
  a third charge accumulation unit, wherein the first electrode of the second pixel is connected to the third charge accumulation unit.

(26)

The imaging device of any of (18) to (25), further comprising: an interpixel electrode, wherein the interpixel electrode encloses the first and second pixels, and wherein the second portion of the first electrode of the first pixel is connected to the interpixel electrode.

(27)

The imaging device of (26), wherein the second portion of the first electrode of the first pixel is connected to the interpixel electrode by an electrode extending portion that is integral to and formed from a same material as the second portion of the first electrode of the first pixel and the interpixel electrode.

(28)

The imaging device of any of (18) to (27), wherein the first and second portions of the first electrode of the first pixel are separated from one another in a vertical direction, and wherein a length of the electrode extending portion in the vertical direction is equal to a length of the second portion of the first electrode of the first pixel in the vertical direction.

(29)

The imaging device of any of (26) to (28), wherein the interpixel electrode is connected to one of ground or a voltage source.

(30)

The imaging device any of (13) to (17), further comprising:
  a plurality of first pixels;
  a plurality of second pixels, wherein the first electrode of each of the first pixels is divided into a first portion and a second portion.

(31)

The imaging device of any of (18) to (29), wherein the first portion of the first electrode of the first pixel is electrically separated from the second portion of the first electrode of the first pixel.

(32)

An imaging device, comprising:
  a first pixel of a first pixel type, including:
    a first electrode, wherein the first electrode is divided into a first portion and a second portion, wherein the first portion of the electrode is separated from the second portion of the first electrode;
    a first portion of a photoelectric conversion film; and
    a first portion of a second electrode, wherein the first portion of the photoelectric conversion film is between the first electrode and the first portion of the second electrode, and wherein the first electrode of the first pixel has a first area; and
  a second pixel of a second pixel type, including:
    a first electrode;
    a second portion of the photoelectric conversion film; and
    a second portion of the second electrode, wherein the second portion of the photoelectric conversion film is between the first electrode and the second portion of the second electrode, wherein the first electrode of the second pixel has a second area, and wherein the first area is larger than the second area in a plan view.

(33)

The imaging device of (32), wherein the first portion of the first electrode is separated from the second portion of the second electrode by a separating section, and wherein the first area of the first electrode of the first pixel includes the first portion of the first electrode, the second portion of the first electrode, and the separating section.

(34)

The imaging device of (32) or (33), wherein a sum of an area of the first portion of the first electrode of the first pixel and an area of the second portion of the first electrode of the first pixel is equal to the second area.

(35)

The imaging device of any of (32) to (34), wherein an area of the first portion of the first electrode of the first pixel is different than an area of the second portion of the first electrode of the first pixel.

(36)

The imaging device of any of (32) to (35), further comprising: a first charge accumulation unit, wherein the first portion of the first electrode of the first pixel is connected to the first charge accumulation unit.

(37)

The imaging device of any of (32) to (36), wherein the second portion of the first electrode of the first pixel is connected to ground.

(38)

The imaging device of any of (32) to (37), wherein an area of the first portion of the first electrode of the first pixel is smaller than an area of the second portion of the first electrode of the first pixel.

(39)

The imaging device of any of (32) to (36) or (38), further comprising:
  a first charge accumulation unit, wherein the first portion of the first electrode of the first pixel is connected to the first charge accumulation unit;
  a second charge accumulation unit, wherein the second portion of the first electrode of the first pixel is connected to the second charge accumulation unit;
  a third charge accumulation unit, wherein the first electrode of the second pixel is connected to the third charge accumulation unit.

(40)

The imaging device of any of (32) to (39), further comprising: an interpixel electrode, wherein the interpixel electrode encloses the first and second pixels, and wherein the second portion of the first electrode of the first pixel is connected to the interpixel electrode.

(41)

The imaging device of any of (32) to (40), wherein the second portion of the first electrode of the first pixel is connected to the interpixel electrode by an electrode extending portion that is integral to and formed from a same material as the second portion of the first electrode of the first pixel and the interpixel electrode.

(42)

The imaging device of any of (32) to (41), wherein the first and second portions of the first electrode of the first pixel are separated from one another in a vertical direction, and wherein a length of the electrode extending portion in the vertical direction is equal to a length of the second portion of the first electrode of the first pixel in the vertical direction.

(43)

The imaging device of any of (40) to (42), wherein the interpixel electrode is connected to one of ground or a voltage source.

(44)

The imaging device of any of (32) to (43), further comprising:
  a plurality of first pixels; and
  a plurality of second pixels.

(45)

The imaging device of any of (32) to (44), wherein the first pixel is a phase difference pixel, and wherein the second pixel is an imaging pixel.

(46)

An electronic apparatus, comprising:
  an optical unit;
  a solid-state imaging device that receives light from the optical unit, the solid-state imaging device including: a plurality of pixels of a first pixel type, each pixel of the first pixel type including:
    a first electrode;
    a first portion of a photoelectric conversion film; and
    a first portion of a second electrode, wherein the first portion of the photoelectric conversion film is between the first electrode and the first portion of the second electrode, and wherein the first electrode has a first area; and
  a plurality of pixels of a second pixel type, each pixel of the second pixel type including:
    a first electrode;
    a second portion of the photoelectric conversion film; and
    a second portion of the second electrode, wherein the second portion of the photoelectric conversion film is between the first electrode and the second portion of the second electrode, wherein the first electrode has a second area, and wherein the first area is larger than the second area in a plan view;
  a control circuit, wherein the control circuit outputs a drive signal that controls operation of the solid-state imaging device; and
  a signal processing circuit, wherein the signal processing circuit receives pixel signals from the solid-state imaging device.

REFERENCE SIGNS LIST

1 Solid-state imaging device
2 Pixel
2X Ordinary pixel
2P Phase difference pixel
3 Pixel array unit
4 Vertical drive circuit
5 Column signal processing circuit
7 Output circuit
51A, 51B, 51C Lower electrode
81 Photoelectric conversion film
82 Upper electrode

What is claimed is:

1. A light detecting device, comprising:
  a first pixel for phase difference detection, comprising:
    a first portion of an upper electrode;
    a first lower electrode; and
    a first portion of a photoelectric conversion film disposed between the first portion of the upper electrode and the first lower electrode;
  a second pixel for phase difference detection, comprising:
    a second portion of the upper electrode;
    a second lower electrode; and
    a second portion of the photoelectric conversion film disposed between the second portion of the upper electrode and the second lower electrode; and
  a third pixel for imaging, comprising:
    a third portion of the upper electrode;
    a third lower electrode; and
    a third portion of the photoelectric conversion film disposed between the third portion of the upper electrode and the third lower electrode,
  wherein a planer area of each of the first lower electrode and the second lower electrode is larger than a planer area of the third lower electrode,
  wherein the third pixel is disposed between the first pixel and the second pixel, and
  wherein the first pixel, the second pixel, and the third pixel have a same planer area.

2. The light detecting device according to claim 1, further comprising:
  a light shielding film, wherein the light shielding film is adjacent to at least a portion of the upper electrode.

3. The light detecting device according to claim 2, wherein the light shielding film is formed adjacent to the first portion and the second portion of the photoelectric conversion film.

4. The light detecting device according to claim 2, wherein the light shielding film is embedded in an interlayer insulating film, and wherein at least a portion of the interlayer insulating film is between the light shielding film and the upper electrode.

5. The light detecting device according to claim 2, wherein the light shielding film is adjacent to one of the first portion of the upper electrode in the first pixel or the second portion of the upper electrode in the second pixel.

6. The light detecting device according to claim 1, further comprising:
  a first charge accumulation unit, wherein the first lower electrode of the first pixel is connected to the first charge accumulation unit.

7. The light detecting device according to claim 1, further comprising:
  a first charge accumulation unit, wherein the first lower electrode of the first pixel and the second lower electrode of the second pixel are connected to the first charge accumulation unit.

8. The light detecting device according to claim 1, wherein the first lower electrode and the second lower electrode are each divided into a first section and a second section.

9. The light detecting device according to claim 8, wherein the first section and the second section have a same size.

10. The light detecting device according to claim 8, wherein the first section and the second section are different sizes.

11. An electronic apparatus, comprising:
an optical unit;
a signal processing circuit; and
a light detecting device, comprising:
　a first pixel for phase difference detection, comprising:
　　a first portion of an upper electrode;
　　a first lower electrode; and
　　a first portion of a photoelectric conversion film disposed between the first portion of the upper electrode and the first lower electrode;
　a second pixel for phase difference detection, comprising:
　　a second portion of the upper electrode;
　　a second lower electrode; and
　　a second portion of the photoelectric conversion film disposed between the second portion of the upper electrode and the second lower electrode; and
　a third pixel for imaging, comprising:
　　a third portion of the upper electrode;
　　a third lower electrode; and
　　a third portion of the photoelectric conversion film disposed between the third portion of the upper electrode and the third lower electrode,
wherein a planer area of each of the first lower electrode and the second lower electrode is larger than a planer area of the third lower electrode,
wherein the third pixel is disposed between the first pixel and the second pixel, and
wherein the first pixel, the second pixel, and the third pixel have a same planer area.

12. The electronic apparatus according to claim 11, further comprising:
a light shielding film, wherein the light shielding film is adjacent to at least a portion of the upper electrode.

13. The electronic apparatus according to claim 12, wherein the light shielding film is formed adjacent to the first portion and the second portion of the photoelectric conversion film.

14. The electronic apparatus according to claim 12, wherein the light shielding film is embedded in an interlayer insulating film, and wherein at least a portion of the interlayer insulating film is between the light shielding film and the upper electrode.

15. The electronic apparatus according to claim 12, wherein the light shielding film is adjacent to one of the first portion of the upper electrode in the first pixel or the second portion of the upper electrode in the second pixel.

16. The electronic apparatus according to claim 11, further comprising:
a first charge accumulation unit, wherein the first lower electrode of the first pixel is connected to the first charge accumulation unit.

17. The electronic apparatus according to claim 11, further comprising:
a first charge accumulation unit, wherein the first lower electrode of the first pixel and the second lower electrode of the second pixel are connected to the first charge accumulation unit.

18. The electronic apparatus according to claim 11, wherein the first lower electrode and the second lower electrode are each divided into a first section and a second section.

19. The electronic apparatus according to claim 18, wherein the first section and the second section have a same size.

* * * * *